US007596015B2

(12) United States Patent
Kitagawa et al.

(10) Patent No.: US 7,596,015 B2
(45) Date of Patent: Sep. 29, 2009

(54) MAGNETORESISTIVE ELEMENT AND MAGNETIC MEMORY

(75) Inventors: Eiji Kitagawa, Sagamihara (JP); Toshihiko Nagase, Sagamihara (JP); Masatoshi Yoshikawa, Yokohama (JP); Katsuya Nishiyama, Yokohama (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 55 days.

(21) Appl. No.: 11/832,203

(22) Filed: Aug. 1, 2007

(65) Prior Publication Data

US 2008/0088980 A1 Apr. 17, 2008

(30) Foreign Application Priority Data

Oct. 13, 2006 (JP) ............................ 2006-280620

(51) Int. Cl.
*G11C 11/00* (2006.01)

(52) U.S. Cl. ....................... 365/158; 365/171; 365/173; 977/935

(58) Field of Classification Search ................. 365/158, 365/171, 173; 977/934, 935
See application file for complete search history.

(56) References Cited

U.S. PATENT DOCUMENTS

| | | | | |
|---|---|---|---|---|
| 6,256,223 | B1 | 7/2001 | Sun | |
| 6,838,740 | B2 * | 1/2005 | Huai et al. | 257/421 |
| 6,967,863 | B2 | 11/2005 | Huai | |
| 2005/0157544 | A1 * | 7/2005 | Min et al. | 365/171 |
| 2007/0086121 | A1 | 4/2007 | Nagase et al. | |
| 2008/0088980 | A1 | 4/2008 | Kitagawa et al. | |

FOREIGN PATENT DOCUMENTS

| | | |
|---|---|---|
| JP | 2006-80287 | 3/2006 |
| WO | WO 2005/083714 | 9/2005 |

OTHER PUBLICATIONS

U.S. Appl. No. 11/832,203, filed Aug. 1, 2007, Kitagawa et al.
U.S. Appl. No. 12/014,522, filed Jan. 15, 2008, Ueda et al.
U.S. Appl. No. 11/844,069, filed Aug. 23, 2007, Yoshikawa et al.
U.S. Appl. No. 12/233,100, filed Sep. 18, 2008, Nagase et al.

* cited by examiner

*Primary Examiner*—Son Dinh
*Assistant Examiner*—Harry W Byrne
(74) *Attorney, Agent, or Firm*—Oblon, Spivak, McClelland, Maier & Neustadt, P.C.

(57) ABSTRACT

A magnetoresistive element includes a free layer which contains a magnetic material and has an fct crystal structure with a (001) plane oriented, the free layer having a magnetization which is perpendicular to a film plane and has a direction to be changeable by spin-polarized electrons, a first nonmagnetic layer and a second nonmagnetic layer which sandwich the free layer and have one of a tetragonal crystal structure and a cubic crystal structure, and a fixed layer which is provided on only one side of the free layer and on a surface of the first nonmagnetic layer opposite to a surface with the free layer and contains a magnetic material, the fixed layer having a magnetization which is perpendicular to a film plane and has a fixed direction.

23 Claims, 15 Drawing Sheets

10
17
14
21
22
12
13
11
15
16

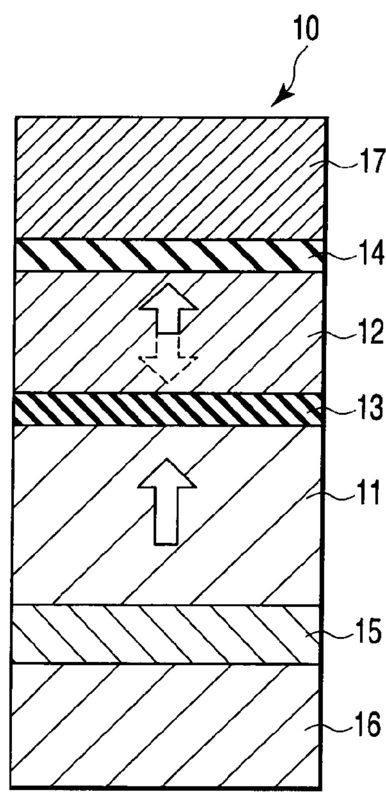
F I G. 1
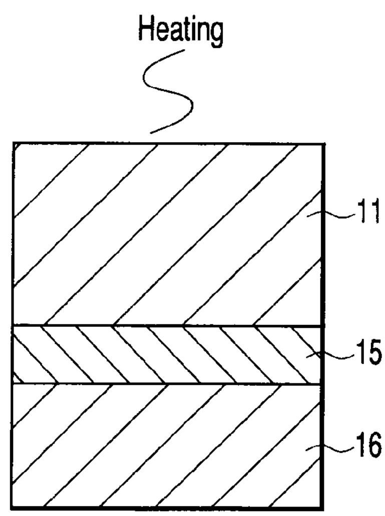
F I G. 2

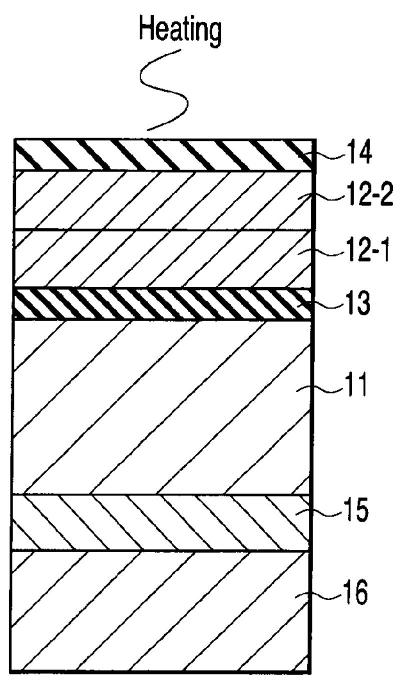
F I G. 3
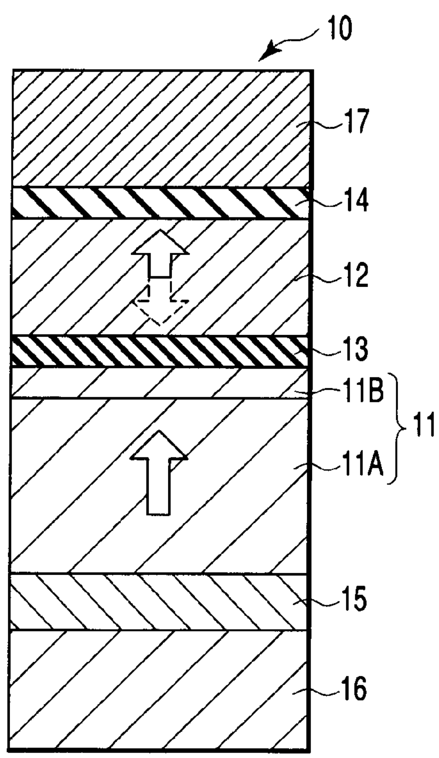
F I G. 4

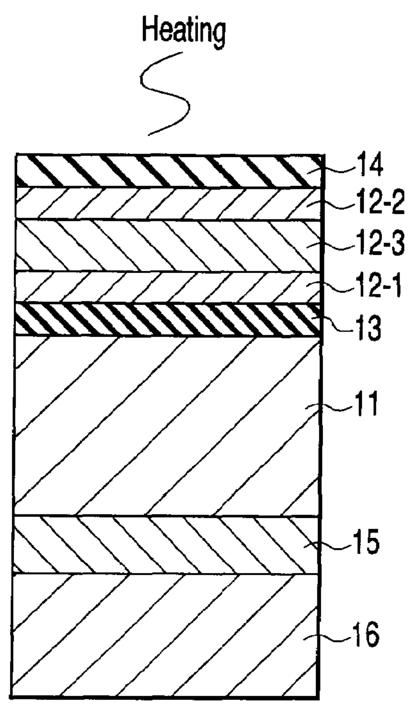
F I G. 7
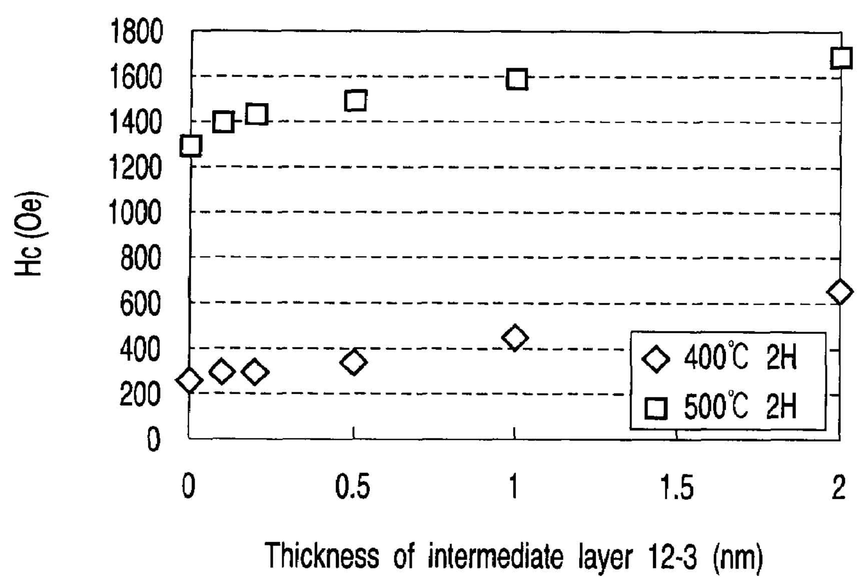
F I G. 8

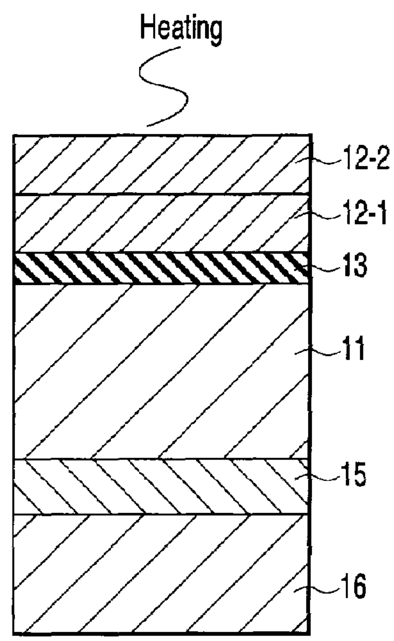
F I G. 16
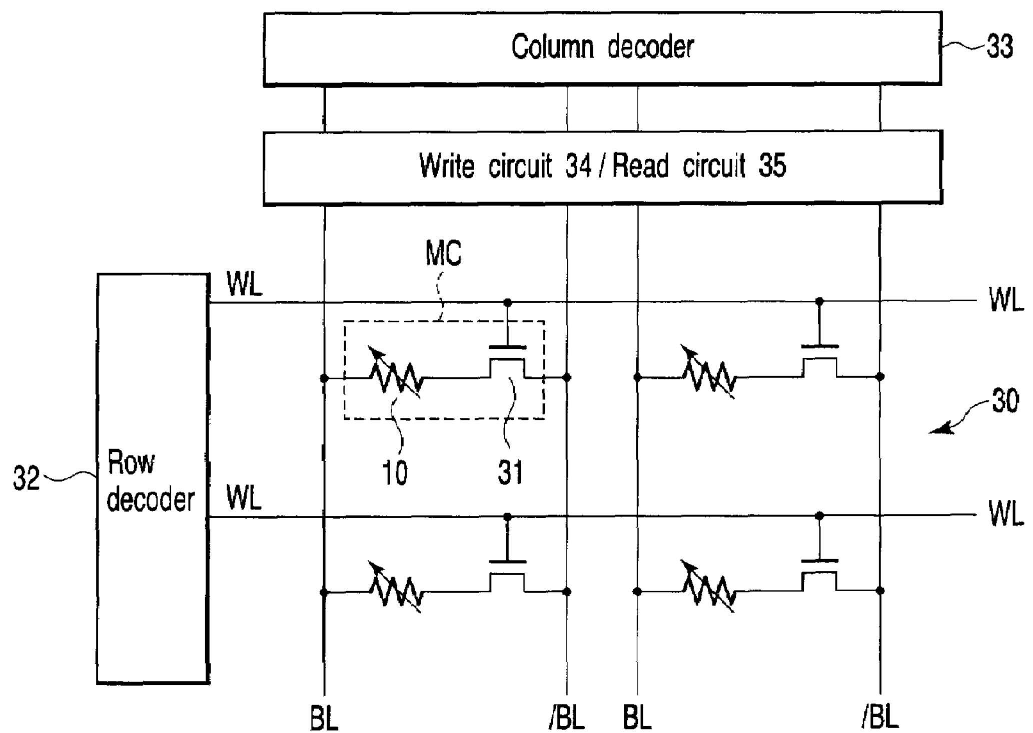
F I G. 17

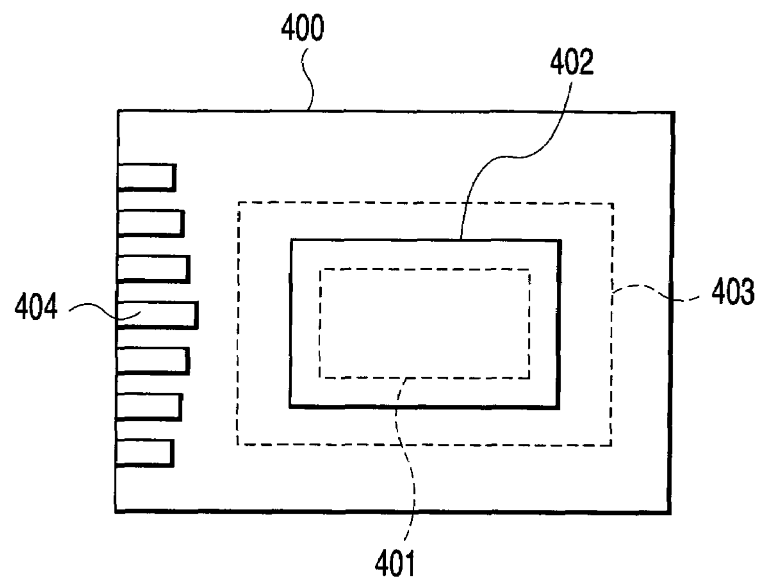
F I G. 2 0
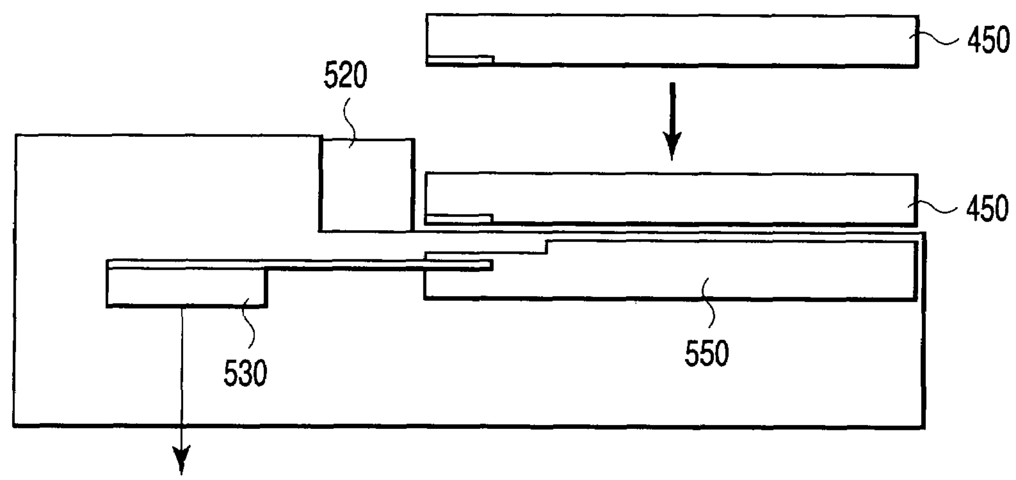
F I G. 2 3

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2006-280620, filed Oct. 13, 2006, the entire contents of which are incorporated herein by reference.

BACKGROUND OF THE INVENTION

1. Field of the Invention

The present invention relates to a magnetoresistive element and a magnetic memory and, for example, to a magnetoresistive element and a magnetic memory which can record information by, e.g., supplying a current.

2. Description of the Related Art

MRAMs (Magnetic Random Access Memories; also referred to as magnetic memories hereinafter) using ferromagnetic materials are expected as nonvolatile memories ensuring nonvolatility, high-speed operation, large capacity, and low power consumption. An MRAM has, as a storage element, an MTJ (Magnetic Tunnel Junction) element using a TMR (Tunneling MagnetoResistive) effect, and stores information in accordance with the magnetization state of the MTJ element.

In a conventional MRAM that writes data on the basis of a magnetic field induced by a current, the value of the current flowing to the interconnection decreases along with microfabrication. It is therefore difficult to supply a sufficient magnetic field induced by a current. In addition, the magnitude of the magnetic field necessary for recording information in the MTJ element increases along with microfabrication. Hence, MRAMs of the 126- to 256-Mbit generation using the magnetic write scheme based on an interconnection current will soon reach their theoretical limits.

There is proposed an MRAM using a write scheme based on SMT (Spin Momentum Transfer) (e.g., U.S. Pat. No. 6,256,223). The SMT (to be referred to as spin injection hereinafter) rarely increases the current density necessary for magnetization switching even when the element becomes small. Hence, an efficient write is possible.

BRIEF SUMMARY OF THE INVENTION

According to a first aspect of the present invention, there is provided a magnetoresistive element comprising:

a free layer which contains a magnetic material and has an fct (face-centered tetragonal) crystal structure with a (001) plane oriented, the free layer having a magnetization which is perpendicular to a film plane and has a direction to be changeable by spin-polarized electrons;

a first nonmagnetic layer and a second nonmagnetic layer which sandwich the free layer and have one of a tetragonal crystal structure and a cubic crystal structure; and a fixed layer which is provided on only one side of the free layer and on a surface of the first nonmagnetic layer opposite to a surface with the free layer and contains a magnetic material, the fixed layer having a magnetization which is perpendicular to a film plane and has a fixed direction.

According to a second aspect of the present invention, there is provided a magnetoresistive element comprising:

a free layer which contains a magnetic material and has an fct crystal structure with a (001) plane oriented, the free layer having a magnetization which is perpendicular to a film plane and has a direction to be changeable by spin-polarized electrons;

a first nonmagnetic layer and a second nonmagnetic layer which sandwich the free layer and have one of a tetragonal crystal structure and a cubic crystal structure;

a first fixed layer which is provided on a surface of the first nonmagnetic layer opposite to a surface with the free layer and contains a magnetic material, the first fixed layer having a magnetization which is perpendicular to a film plane and has a fixed direction; and a second fixed layer which is provided on a surface of the second nonmagnetic layer opposite to a surface with the free layer and contains a magnetic material, the second fixed layer having a magnetization which is perpendicular to a film plane and has a fixed direction, wherein the first nonmagnetic layer has a resistance value different from that of the second nonmagnetic layer.

According to a third aspect of the present invention, there is provided a magnetic memory comprising a memory cell including: the magnetoresistive element, and a first electrode and a second electrode which sandwich the magnetoresistive element and through which a current is supplied to the magnetoresistive element.

BRIEF DESCRIPTION OF THE SEVERAL VIEWS OF THE DRAWING

FIG. 1 is a sectional view illustrating the structure of an MTJ element 10 according to the first embodiment;

FIG. 2 is a sectional view illustrating a manufacturing method of the MTJ element 10 according to the first embodiment;

FIG. 3 is a sectional view illustrating a manufacturing method of the MTJ element 10 following FIG. 2;

FIG. 4 is a sectional view illustrating the structure of an MTJ element 10 according to the second embodiment;

FIG. 7 is a sectional view illustrating a manufacturing method of the MTJ element 10 according to the fourth embodiment;

FIG. 8 is a graph illustrating the magnetic characteristic of the MTJ element 10;

FIG. 16 is a sectional view illustrating a manufacturing method of the MTJ element 10 according to the seventh embodiment;

FIG. 17 is a circuit diagram illustrating the arrangement of an MRAM according to the eighth embodiment;

FIG. 20 is a plan view illustrating an example of an MRAM applied to a card (MRAM card) so as to explain Application Example 3 of the MRAM;

FIG. 23 is a sectional view illustrating a fitting type transfer apparatus to transfer data to an MRAM card.

DETAILED DESCRIPTION OF THE INVENTION

Figure 5:
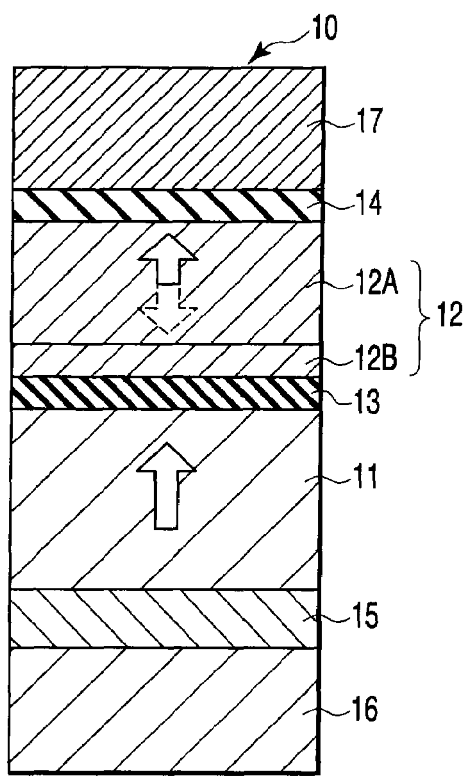
FIG. 5 is a sectional view illustrating the structure of an MTJ element 10 according to the third embodiment.

To increase the capacity of an MRAM, it is necessary to microfabricate a ferromagnetic material into a cell size complying with the degree of integration of cells. In design of, e.g., a 1-Gbit MRAM, the cell size is assumed to be 100 nm or less. To obtain a larger capacity, the cell size must be smaller. As the cell size of a ferromagnetic material decreases, the magnetization direction freely changes due to the influence of thermal vibration caused by the thermal fluctuation aftereffect. The influence of the thermal fluctuation aftereffect will be explained by using an example of single magnetic-domain with a uniaxial magnetic anisotropy.

Let Ku be the magnetic anisotropy energy density, and V be the activation volume of a ferromagnetic material. A magnetic anisotropy energy U is given by U=KuV. At a given temperature T, atoms have a thermal vibration energy $K_BT$. When the thermal vibration energy is larger than the magnetic anisotropy energy U, magnetization switching readily occurs. That is, when $KuV<K_BT$ (or $KuV/K_BT<1$), a ferromagnetic cell behaves to exhibit magnetization that behaves like a paramagnetic material. A paramagnetic material cannot function as a storage element because it cannot hold magnetization in one direction. Hence, the minimum necessary condition is $KuV/K_BT>1$.

A ferromagnetic material used in a storage element needs to be able to hold magnetic information for several years. The condition $KuV/K_BT>1$ includes no time information. To decrease the probability of magnetization switching in, e.g., a 1-Gbit memory cell for 10 years to 1 bit or less, $KuV/K_BT>60$ or more is necessary.

The magnetic anisotropy energy U is directly proportional to the product of the magnetic anisotropy energy density Ku and the activation volume V of a ferromagnetic material. As the element size becomes small, the activation volume V of the element decreases. On the other hand, to store nonvolatile information in a ferromagnetic cell, it is necessary to satisfy the condition $KuV/K_BT>60$. To do this, the magnetic anisotropy energy density Ku must be raised to compensate for the decrease in activation volume V. When the film thickness is 3 nm, and the element size is 100 nm, Ku must be $1\times10^5$ erg/cc or more. When the element size is 40 nm, Ku must be $6\times10^5$ erg/cc or more.

To ensure the magnetic anisotropy energy in an MRAM, two methods have been examined: a method using a shape magnetic anisotropy energy and a method using a magnetocrystalline anisotropy energy. The shape magnetic anisotropy energy is proportional to, e.g., a planar shape, film thickness, and element width, as is known. To ensure the magnetic anisotropy energy by using a shape magnetic anisotropy in an element size of 40 nm or less, it is necessary to design an elongated planar shape or a thick element film.

To ensure the magnetic anisotropy energy based on only the planar shape while fixing the film thickness to 3 nm, the aspect ratio must be 3 or more, resulting in difficulty in increasing the capacity. To ensure the magnetic anisotropy energy by thickening the film while fixing the planar shape to an ellipse with an aspect ratio of 2, the film thickness must be 4 nm or more. An increase in film thickness leads to an increase in spin injection current. It is therefore difficult to use a shape magnetic anisotropy to compensate for the magnetic anisotropy energy in a small ferromagnetic cell with a size of several ten nm or less.

Consider a case wherein the magnetic anisotropy energy is ensured by using a magnetocrystalline anisotropy energy. A magnetocrystalline anisotropy is generated from crystal symmetry. Some ferromagnetic materials do not have a uniaxial anisotropy, but have an anisotropy in a plurality of axes depending on the crystal structure. To impart binary information into a ferromagnetic material, two magnetization directions, i.e., 0° direction (assumed to be "1") and 180° direction (assumed to be "0") are preferably obtained in a stable state. However, if there are two or more directions of magnetocrystalline anisotropy, two or more stable states can be obtained.

For example, a ferromagnetic material having a magnetic anisotropy in the X and Y directions can direct its N-pole in four directions, i.e., +X, +Y, −X, and −Y directions in a stable state. Magnetization switching preferably occurs in only two directions, i.e., +X and −X directions upon spin injection. Hence, the +Y and −Y directions must not exist. However, since the N-pole can be directed in the +Y and −Y directions, the magnetization may be fixed in the +Y or −Y direction due to some fault during magnetization switching. It is consequently impossible to accurately store "1" or "0" information.

That is, to use a magnetocrystalline anisotropy for the magnetic anisotropy energy, a material having a uniaxial magnetic anisotropy must be used. Assume that a uniaxial magnetic anisotropy is used in an in-plane magnetization structure. If a CoCr alloy used in, e.g., a hard disk medium is used as a material with a high magnetocrystalline anisotropy energy density, the crystal axes are greatly dispersed in a plane. This induces a decrease in MR (Magnetic Resistance) and incoherent precession, resulting in an increase in the spin injection switching current.

If the crystal axes are directed in the perpendicular direction, they are aligned along only the Z-axis. This suppresses dispersion of crystal axes. The following methods are available to direct the crystal axes in the Z direction. Films made of different materials are stacked, and an anisotropy induced in the interfaces of the stacked films is used. A hexagonal structure is grown in the [001] direction with respect to the film plane, and a magnetocrystalline anisotropy induced from crystal symmetry is used. The size of the crystal lattice is changed between the in-plane direction and the perpendicular direction. Alternatively, magnetostriction is used.

Of materials having a perpendicular magnetic anisotropy, an example of a material with a high magnetocrystalline anisotropy is an $L1_0$ FePt ordered alloy. The FePt thin film has a magnetocrystalline anisotropy energy in order of $10^7$ to $10^8$ erg/cc. If the magnetocrystalline anisotropy is $4\times10^7$ erg/cc, the size of an MTJ element can be reduced to several nm.

A giant TMR effect of more than 1000% is predicted theoretically by a first-principles calculation regarding an epitaxial MTJ element of Fe(001)/MgO(001)/Fe(001) using single-crystal magnesium oxide (MgO) in a tunnel barrier layer. Note that the left side of "/" indicates an upper layer, and the right side indicates a lower layer. An MTJ element with a high MR is expected to obtain a high spin polarizability. According to Sloncewski's equation, which analytically solves the behavior of spin injection magnetization switching, the spin injection magnetization switching current decreases along with an increase in spin polarizability. For this reason, when MgO is used for the tunnel barrier layer of an MTJ element, the current of the MRAM is expected to be small.

When MgO crystallized in the [001] direction and Fe, Pt, and Fe crystallized in the [001] direction are sequentially stacked in monolayers, FePt having a perpendicular magnetic anisotropy can be prepared. This structure can ensure a highly efficient spin injection torque and a high thermal stability and is therefore expected to be applicable to a large-capacity memory cell to be driven at low power consumption.

Formation of an FePt thin film by a vapor quenching method such as sputtering is done without passing through a thermodynamic disorder-order transformation point in the solid phase. For this reason, a metastable fcc (face-centered cubit) disordered phase (A1 phase) is formed immediately after film formation. To transform the metastable A1 phase to an $L1_0$ ordered structure, lattice diffusion of atoms is necessary. For this, annealing at about 600° C., i.e., ½ the melting point of an FePt alloy must be executed.

However, since a ferromagnetic cell has a MOS transistor formed on an FEOL (Front End Of Line) interconnection, it is very difficult to perform such high temperature annealing from the viewpoint of damage to the MOS transistor and damage to the FEOL interconnection. It is therefore necessary to transform the A1 phase to an $L1_0$ ordered structure by annealing at a low temperature.

The disorder-order transformation requires interdiffusion between Fe and Pt. In addition, since an FePt ordered alloy has an fct (face-centered tetragonal) structure and contracts in the C-axis direction, the elastic energy involved in contraction in the C-axis direction must be overcome at the time of transformation. More specifically, to lower the disorder-order transformation temperature, a method that reduces the activation energy in interdiffusion between Fe and Pt or reduces the elastic energy generated between Fe and Pt is required.

The embodiments of the present invention based on the above-described findings will be described below with reference to the accompanying drawing. The same reference numerals denote elements with the same functions and structures, and a repetitive description thereof will be given only if necessary.

First Embodiment

FIG. 1 is a sectional view illustrating the structure of an MTJ element 10 according to the first embodiment. Arrows in FIG. 1 indicate magnetization directions. In this embodiment, the MTJ element 10 having a single pinned layer structure (i.e., a structure that arranges a free layer and a pinned layer on both sides of a nonmagnetic layer) will be described.

The MTJ element 10 has a layered structure formed by sequentially stacking a crystal orientation underlayer 15, fixed layer (also referred to as a magnetization fixed layer or pinned layer) 11, tunnel barrier layer (nonmagnetic layer) 13, recording layer (also referred to as a magnetization free layer or free layer) 12, and cap layer 14. The layered structure may have a reversed stacking order. A lower electrode 16 is provided on the lower surface of the crystal orientation underlayer 15. An upper electrode 17 is provided on the upper surface of the cap layer 14.

The fixed layer 11 has a fixed magnetization (or spin) direction. The magnetization direction of the recording layer 12 changes (switches). The directions of easy magnetization of the fixed layer 11 and recording layer 12 are perpendicular to the film plane (or stacking plane) (this magnetization will be referred to as perpendicular magnetization hereinafter). That is, the MTJ element 10 is a so-called perpendicular magnetic MTJ element in which the magnetization directions of the fixed layer 11 and recording layer 12 are perpendicular to the film plane.

A direction of easy magnetization is a direction that minimizes the internal energy of a ferromagnetic material with a macroscopic size when spontaneous magnetization without an external magnetic field is directed in such direction. A direction of hard magnetization is a direction that maximizes the internal energy of a ferromagnetic material with a macroscopic size when spontaneous magnetization without an external magnetic field is directed in such direction.

When a magnetic layer with a large switching current is used as the fixed layer 11, and a magnetic layer with a switching current smaller than that of the fixed layer 11 is used as the recording layer 12, a high-performance MTJ element 10 can be obtained. When magnetization switching is caused by spin-polarized electrons, the switching current is proportional to the saturation magnetization, anisotropy magnetic field, and activation volume. By appropriately adjusting these factors, a difference can be generated between the switching current of the recording layer 12 and that of the fixed layer 11.

As the recording layer 12 and fixed layer 11 to implement perpendicular magnetization, a magnetic material having an $L1_0$ structure or $L1_2$ structure based on an fct (face-centered tetragonal) structure with the (001) plane oriented is used. A magnetic material having a high magnetocrystalline anisotropy energy density of, e.g., $5\times10^5$ erg/cc or more is preferable.

Detailed examples of the magnetic material of the recording layer 12 and fixed layer 11 are an ordered alloy having an $L1_0$ crystal structure and containing at least one element of Fe (iron), Co (cobalt), Ni (nickel), Mn (manganese), and Cr (chromium), and at least one element of Pt (platinum), Pd (palladium), Rh (rhodium), Au (gold), Hg (mercury), and Al (aluminum).

Examples of the ordered alloy are $Fe_{50}Pt_{50}$, $Fe_{50}Pd_{50}$, $Co_{50}Pt_{50}$, $Co_{50}Pd_{50}$, $Fe_{30}Ni_{20}Pt_{50}$, $Co_{30}Fe_{20}Pt_{50}$, $Co_{30}Ni_{20}Pt_{50}$, $Mn_{50}Al_{50}$, and $Fe_{50}Ni_{50}$. The composition ratios of these ordered alloys are merely examples and are therefore not limiting. The magnetic anisotropy energy density and saturation magnetization can be lowered by adding an impurity element such as Cu (copper), Zn (zinc), Ag (silver), Ni (nickel), Co (cobalt), Fe (iron), Mn (manganese), Cr (chromium), V (vanadium), Ti (titanium), or Os (osmium), an alloy thereof, or an insulating materiel to the ordered alloys. An $L1_2$ ordered alloy prepared by adjusting the composition ratio is also usable.

When an $Fe_{50}Pt_{50}$ layer having a thickness of, e.g., 4 nm is used as the recording layer 12 and an $Fe_{50}Pt_{50}$ layer is used also as the fixed layer 11, the magnetization switching current of the fixed layer 11 must be larger than that of the recording layer 12. To do this, the fixed layer 11 must be thicker than the recording layer 12. For example, a 10- to 20-nm thick layer can be used as the fixed layer 11 whose magnetization direction does not switch upon writing information.

The fixed layer 11 needs to satisfy one or more of the following conditions: the anisotropy magnetic field is larger than that of the recording layer 12, the saturation magnetization is larger than that of the recording layer 12, the thickness is larger than that of the recording layer 12, and the dumping constant is larger than that of the recording layer 12. Except for $Fe_{50}Pt_{50}$, an $L1_0$ crystal material or $L1_2$ crystal material thicker than the recording layer 12 may be used. The following magnetic materials (1) to (3) are also usable for the fixed layer 11.

(1) Disordered Alloys

Alloys containing Co (cobalt) as the main component and at least one element of Cr (chromium), Ta (tantalum), Nb (niobium), V (vanadium), W (tungsten), Hf (hafnium), Ti (titanium), Zr (zirconium), Pt (platinum), Pd (palladium), Fe (iron), and Ni (nickel). Examples are a CoCr alloy, CoPt alloy, CoCrTa alloy, CoCrPt alloy, CoCrPtTa alloy, and CoCrNb alloy. These alloys can adjust the magnetic anisotropy energy density and saturation magnetization by increasing the ratio of a nonmagnetic element.

(2) Artificial Lattices

A layered film formed by alternately stacking an alloy containing at least one element of Fe (iron), Co (cobalt), and Ni (nickel) and an alloy containing at least one element of Cr (chromium), Pt (platinum), Pd (palladium), Ir (iridium), Rh (rhodium), Ru (ruthenium), Os (osmium), Re (rhenium), Au (gold), and Cu (copper). Examples are a Co/Pt artificial lattice, Co/Pd artificial lattice, CoCr/Pt artificial lattice, Co/Ru artificial lattice, Co/Os artificial lattice, Co/Au artificial lattice, and Ni/Cu artificial lattice. These artificial lattices can adjust the magnetic anisotropy energy density and saturation magnetization by adjusting the amount of doping of an element in the magnetic layer and the film thickness ratio of the magnetic layer and nonmagnetic layer.

(3) Ferrimagnetic Materials

Ferrimagnetic materials made of alloys of rare-earth metals and transition metals. An example is an amorphous alloy containing at least one element of Tb (terbium), Dy (dysprosium), and Gd (gadolinium), and at least one of transition metals. Examples are TbFe, TbCo, TbFeCo, DyTbFeCo, and GdTbCo. These alloys can adjust the magnetic anisotropy energy density and saturation magnetization by adjusting the composition ratio.

As the tunnel barrier layer 13 and cap layer 14, a nonmagnetic material having a tetragonal or cubic crystal structure is used. As the tunnel barrier layer 13, an oxide containing at least one element of Li (lithium), Be (beryllium), Na (sodium), Mg (magnesium), Nb (niobium), Ti (titanium), V (vanadium), Ta (tantalum), and Ba (barium), or a nitride containing at least one element of Ti (titanium) and V (vanadium) is used.

The following nonmagnetic materials (1) to (6) are usable for the cap layer 14.

(1) An oxide containing at least one element of Li (lithium), Be (beryllium), Na (sodium), Mg (magnesium), Nb (niobium), Ti (titanium), V (vanadium), Ta (tantalum), and Ba (barium)

(2) A nitride containing at least one element of Ti (titanium) and V (vanadium)

(3) A carbide containing V (vanadium)

(4) A hydride containing at least one element of Li (lithium) and Pd (palladium)

(5) A selenide containing at least one element of Zr (zirconium) and Ho (holmium)

(6) A metal or intermetallic compound containing at least one element of Al (aluminum), Au (gold), As (arsenic), Ag (silver), Be (beryllium), Ga (gallium), P (phosphorus), Pt (platinum), Pd (palladium), Ir (iridium), Rh (rhodium), Cu (copper), V (vanadium), Cr (chromium), Nb (niobium), Mo (molybdenum), Ta (tantalum), and W (tungsten)

The underlayer 15 is provided to control the crystal orientation or crystallinity of the layer on the underlayer 15. To make the fixed layer 11 exhibit a perpendicular magnetic anisotropy, it must have an fct structure with the (001) plane oriented. For this purpose, a several-nm thick MgO (magnesium oxide) layer is used as the underlayer 15. In addition, an element or a compound having an fcc structure or bcc (body-centered cubic) structure with a lattice constant of about 2.8 Å, 4 Å, or 5.6 Å, and for example, Pt (platinum), Pd (palladium), Ag (silver), Au (gold), Al (aluminum), Cr (chromium), or an alloy containing them as the main component is usable as the underlayer 15. The lower electrode 16 and upper electrode 17 use, e.g., Ta (tantalum).

In the MTJ element 10 having the above-described structure, information is written in the following way. First, the MTJ element 10 is energized to flow a current in both directions perpendicular to the film plane (or stacking plane).

When electrons are supplied from the side of the fixed layer 11 (i.e., electrons move from the fixed layer 11 to the recording layer 12), electrons spin-polarized in the same direction as the magnetization of the fixed layer 11 are injected into the recording layer 12. In this case, the magnetization of the recording layer 12 is aligned in the same direction as the magnetization of the fixed layer 11 so that the magnetizations of the fixed layer 11 and recording layer 12 have a parallel alignment. In this parallel alignment, the resistance value of the MTJ element 10 is minimum. This state is defined as data "0".

When electrons are supplied from the side of the recording layer 12 (i.e., electrons move from the recording layer 12 to the fixed layer 11), electrons reflected by the fixed layer 11 and spin-polarized in a direction reverse to the magnetization of the fixed layer 11 are injected into the recording layer 12. In this case, the magnetization of the recording layer 12 is aligned in the direction reverse to the magnetization of the fixed layer 11 so that the magnetizations of the fixed layer 11 and recording layer 12 have an antiparallel alignment. In this antiparallel alignment, the resistance value of the MTJ element 10 is maximum. This state is defined as data "1".

Data is read out by supplying a read current to the MTJ element 10. The read current is set to a value smaller than the write current. The resistance value of the MTJ element 10 changes depending on whether the magnetizations of the fixed layer 11 and recording layer 12 have a parallel alignment or an antiparallel alignment due to the TMR effect. The change in resistance value is read out on the basis of the read current.

An example manufacturing method of the MTJ element 10 will be described next. When an FePt layer serving as the recording layer 12 is formed at room temperature, the FePt alloy has a disordered phase. To obtain an FePt ordered alloy, film formation at a high temperature of about 300° C. is necessary. Alternatively, when Fe and Pt layers are sequentially formed and heated to about 400° C., the FePt alloy can change to an ordered alloy. To make the recording layer 12 exhibit a perpendicular magnetic anisotropy, it must have an fct structure with the (001) plane oriented. The recording layer 12 with the (001) plane oriented can be formed by using the MgO tunnel barrier layer 13 with the (001) plane oriented.

First, as shown in FIG. 2, the lower electrode 16 (e.g., a Ta layer with a thickness of about 100 nm) and the underlayer 15 are sequentially formed on a substrate (not shown). For example, an FePt layer with a thickness of about 10 nm is formed on the underlayer 15 as the fixed layer 11 so that it has the (001) plane oriented. Ordering of the fixed layer 11 is possible by forming the FePt alloy layer at a high temperature. Alternatively, when Fe and Pt layers are sequentially formed, and the layered film is heated, the fixed layer 11 can change to an ordered structure.

Next, as shown in FIG. 3, the substrate is cooled down to near room temperature. An MgO layer with a thickness of about 0.4 to 1.0 nm is formed as the tunnel barrier layer 13. To suppress oxidation of the fixed layer 11, the tunnel barrier layer 13 may be formed by sequentially forming an Mg layer with a thickness of about 0.4 nm and an MgO layer with a thickness of about 0.6 nm. With this process, the MgO layer has the (001) plane oriented. The formed MgO layer may be heated to about 300° C. to improve its crystallinity. An interface layer having a thickness of about 0.4 to 3 nm and containing Fe or Co as the main component may be inserted between the fixed layer 11 and the tunnel barrier layer 13 to improve the spin polarizability. The interface layer can improve the orientation of the MgO.

An Fe layer having a thickness of about 2 nm and a bcc (body-centered cubic) structure with the (001) plane oriented is formed on the tunnel barrier layer 13 as a first magnetic layer 12-1. Next, a Pt layer having a thickness of about 2 nm and an fcc (face-centered cubic) structure with the (001) plane oriented is formed on the first magnetic layer 12-1 as a second magnetic layer 12-2. The Fe and Pt layers prospectively serve as the recording layer 12 later. An FePt alloy may be used for the second magnetic layer 12-2. The FePt alloy used for the second magnetic layer 12-2 preferably contains Pt at a higher concentration. In forming the recording layer 12, the stacking order of the Pt and Fe layers may be reversed. That is, the Pt layer and the Fe layer may be stacked in this order. However, depositing the Fe layer first is more preferable because the lattice misfit to MgO is small.

An MgO layer, as the cap layer 14, with a thickness of about 0.4 to 0.9 nm is formed on the second magnetic layer 12-2. To suppress oxidation of the recording layer 12, the cap layer 14 may be formed by sequentially forming an Mg layer with a thickness of about 0.4 nm and an MgO layer with a thickness of about 0.5 nm. When the layered film is heated to about 400° C. or more, the FePt alloy of the recording layer 12 changes to an $L1_0$ ordered alloy. An effect of expanding the in-plane lattice of the FePt alloy promotes ordering, as will be described later. Hence, the recording layer 12 can obtain a high perpendicular magnetic anisotropy. It is also effective for ordering FePt to heat the layered film to a temperature of 400° C. or less, and for example, 300° C. to improve the crystallinity of the MgO layer serving as the cap layer 14 before the annealing at about 400° C.

The substrate is cooled down to near room temperature. A Ta layer with a thickness of about 100 nm is formed on the cap layer 14 as the upper electrode 17. At this time, Ta diffuses into the recording layer 12 through the thin MgO cap layer 14. To prevent this, a layer of, e.g., Ru (ruthenium), Au (gold), Ag (silver), Pt (platinum), Pd (palladium), Rh (rhodium), or Ir (iridium) is inserted between the cap layer 14 and the upper electrode 17 as an anti-diffusion layer. The MTJ element 10 shown in FIG. 1 is thus completed.

After the Fe layer and Pt layer each having a thickness of about of 2 nm are formed, the FePt ordered alloy is prepared by using interdiffusion between Fe and Pt in the annealing. This is because the lattice misfit between MgO and FePt is as high as about 8.6%. When the recording layer 12 thickens, the current value necessary for magnetization switching of the recording layer 12 increases. If the thickness of the recording layer 12 is more than the spin diffusion length, the spin torque in the recording layer 12 relaxes, and the current value necessary for magnetization switching of the recording layer 12 increases. Hence, the thickness of the recording layer 12 is preferably 10 nm or less.

As described above, the lattice misfit between the FePt alloy ordered to $L1_0$ and MgO having an NaCl crystal structure (corresponding to the tunnel barrier layer 13 and cap layer 14) is as high as about 8.6%. For this reason, as the recording layer 12 becomes thinner, the FePt alloy separates to grains. If the FePt alloy changes to grains, the thermal stability of the recording layer 12 lowers. If a Ku or thickness of the recording layer 12 increase for covering the lowered thermal stability, the magnetization switching current value of the recording layer 12 increases.

However, the lattice misfit between MgO and bcc-Fe with the (100) plane oriented is about 3.7%. The lattice misfit between fcc-Pt with (100) plane oriented and bcc-Fe with the (100) plane oriented is about 3.2%. Even when the recording layer 12 thins, granulation of the film can be suppressed. Additionally, when annealing is executed after the MgO layer serving as the cap layer 14 is formed on the FePt layered film, Fe and Pt cause interdiffusion so that an FePt alloy ordered to $L1_0$ is formed. Using the tunnel barrier layer 13 and cap layer 14 excellently lattice-matching with the recording layer is effective for obtaining uniform FePt.

The ordering temperature of the FePt alloy can be lowered by, e.g., increasing the difference in Gibbs' free energy between the disordered phase and the ordered phase, increasing the activation energy for diffusion of Fe and Pt, or increasing the concentration gradient near the two-phase interface of Fe and Pt. In this embodiment, the concentration gradient of atoms near the two-phase interface is increased by stacking the Fe and Pt layers. Since this promotes ordering of the FePt alloy, the ordering temperature can be lower.

The lattice misfit between MgO and the FePt alloy expands the in-plane lattice of the FePt ordered phase. This increases the difference in Gibbs' free energy between the FePt disordered phase and the FePt ordered phase and promotes ordering of the FePt alloy. Consequently, the ordering temperature of the FePt alloy becomes lower. The MgO layers serving as the tunnel barrier layer 13 and cap layer 14 have the effect of lowering the ordering temperature by increasing the difference in Gibbs' free energy between the disordered phase and the ordered phase.

Interdiffusion between a metal film and an insulating film is less than that between metal films. Even if annealing is executed at a high temperature, the influence of MgO diffusion into the FePt layered film is small. For this reason, when the crystalline MgO insulating film is used as the cap layer 14, and disorder-order transformation of the FePt layered film is caused by annealing, ordering at a low temperature, formation of a uniform FePt film, and improvement of the magnetic characteristic are possible.

The lattice misfit on the (100) plane between the $Fe_{50}Pt_{50}$ alloy ordered to $L1_0$ and MgO having an NaCl crystal structure is as high as about 8.6% in terms of the bulk value. However, in the embodiment, the lattice misfit between the FePt alloy and MgO is suppressed to less than 8.6% because the in-plane lattice of the FePt alloy expands while the in-plane lattice of MgO contracts.

If an insulating material is used for the cap layer 14, the MR ratio of the MTJ element 10 may decrease. To prevent this, a resistance value R2 of the cap layer 14 is preferably smaller than a resistance value R1 of the tunnel barrier layer 13. To satisfy R1>R2, Cu is mixed into MgO of the cap layer 14 to reduce its resistance value R2. Alternatively, when the MgO layer serving as the cap layer 14 is thinner than the tunnel barrier layer 13, R1>R2 holds. A semiconductor or a metal with a resistance lower than that of the tunnel barrier layer 13 may be used for the cap layer 14. However, the material used for the cap layer 14 preferably ensures excellent lattice matching with the recording layer 12.

Ordering of the recording layer 12 made of a magnetic material is promoted by using the following methods (1) to (6). As a result, the ordering temperature of the recording layer 12 can become lower.

(1) When the melting point of the alloy containing the magnetic material as the main component of the recording layer 12 drops, the ordering temperature can be lowered. More specifically, at least one element of Be (beryllium), Mn (manganese), Cu (copper), Sm (samarium), Au (gold), Nd (neodymium), Ag (silver), Pr (praseodymium), La (lanthanum), Ca (calcium), Yb (ytterbium), Eu (europium), Ce (cerium), Sr (strontium), Ba (barium), Al (aluminum), Mg (magnesium), Zn (zinc), Pb (lead), Cd (cadmium), Sn (tin), and In (indium) is added to the alloy (e.g., FePt alloy). This lowers the ordering temperature of the FePt alloy.

(2) To reduce the activation energy for diffusion of atoms, lattice vacancies are formed in the alloy (e.g., FePt) containing the magnetic material as the main component of the recording layer 12 by some method, thereby reducing the activation energy upon diffusion. More specifically, an element such as Sn (tin), Sb (antimony), Pb (lead), or Bi (bismuth) that is difficult to solid-solve in Fe or Pt is forcibly solid-solved in FePt. When the solid-solved material diffuses outward or precipitates upon annealing, lattice vacancies are formed. This lowers the ordering temperature of the recording layer 12.

(3) The ordering of the recording layer 12 can be promoted by adding a material with a high ionization tendency to it. More specifically, at least one element of Li (lithium), Na (sodium), K (potassium), Be (beryllium), Mg (magnesium), Ca (calcium), and Sc (scandium) is added to the magnetic material as the main component of the recording layer 12. This lowers the ordering temperature of the recording layer 12.

(4) To suppress an increase in elastic energy upon disorder-order transformation, it is effective to add an interstitial element such as B (boron) or C (carbon) to the magnetic material as the main component of the recording layer 12. This is because B preferentially enters along the C-axis of the $L1_0$ structure to suppress lattice deformation of the C-axis so that the activation energy upon disorder-order transformation decreases. This lowers the ordering temperature of the recording layer 12.

(5) The ordering temperature can be lowered by reducing the oxygen content of the recording layer 12. More specifically, the recording layer 12 contains, as the main component, an alloy made of at least one first element of Fe, Co, Ni, Mn, and Cr, and at least one second element of Pt, Pd, Rh, Au, Hg, and Al. The composition ratio of the first element and the second element is 40 to 60 atomic %, and the oxygen content of the alloy is 1% or less. This is achieved by executing the annealing of the recording layer 12 in, e.g., a vacuum.

(6) When the recording layer 12 is formed in a high Ar (argon) gas to contract the C-axis and suppress an increase in elastic energy, the ordering temperature of the recording layer 12 can be lowered.

Oxidation of the recording layer 12 increases the magnetic anisotropy energy density Ku. More specifically, the recording layer 12 contains, as the main component, an alloy made of at least one first element of Fe, Co, Ni, Mn, and Cr, and at least one second element of Pt, Pd, Rh, Au, Hg, and Al. The content of the first element is smaller than that of the second element. The oxygen content of the alloy is 10% or more. The recording layer 12 having this structure can increase its magnetic anisotropy energy density Ku.

As described above in detail, according to this embodiment, even when the recording layer 12 made of a magnetic material is thinned, its perpendicular magnetic anisotropy and thermal stability can be improved. Since an improvement of perpendicular magnetic anisotropy allows the recording layer 12 to cause magnetization switching by a very small current, the write current necessary for magnetization switching can be reduced.

It is also possible to lower the ordering temperature of the magnetic material of the recording layer 12. That is, the perpendicular magnetic MTJ element 10 (more specifically, a perpendicular magnetic recording layer) with high reliability can be formed by a low temperature annealing. This allows to suppress any damage to the peripheral circuits of the MTJ element 10 (damage to the MOS transistor and damage to the FEOL (Front End Of Line) interconnection).

The lattice misfit between MgO having an NaCl crystal structure and the (001) plane oriented and FePt with the (001) plane oriented is as high as 8.6%. When disorder-order transformation occurs, a twin crystal is formed in FePt to reduce the lattice misfit. As a result, the crystal axes disperse to degrade the perpendicular magnetic anisotropy. In addition, the lattice of MgO is distorted to reduce the lattice misfit between FePt and MgO, degrading the tunnel current. Similarly, FePt granulates to reduce the lattice misfit, resulting in a decrease in the effective volume of the magnetic material and degradation of the thermal stability.

In this embodiment, however, even when the recording layer 12 made of a magnetic material is thinned, granulation of the recording layer 12 can be suppressed. Since twin crystal formation in the recording layer 12 can be suppressed, the crystal axes do not disperse. This allows to improve the perpendicular magnetic anisotropy and thermal stability of the recording layer 12.

The recording layer 12 and fixed layer 11 are formed from perpendicular magnetic films. That is, the anisotropy magnetic field necessary for thermally stabilizing the recording layer 12 and fixed layer 11 is obtained by the magnetocrystalline anisotropy. Since this allows to decrease the aspect ratio of the MTJ element 10, microfabrication of the MTJ element 10 is possible.

Even when the MTJ element 10 is microfabricated, the switching current density does not increase. It is therefore possible to embody a magnetic random access memory having a large capacity (e.g., 256 Mbits or more) and including small MTJ elements 10 of 90 nm or less, which was previously impossible.

Second Embodiment

In the second embodiment, a magnetic layer to control the crystallinity of a tunnel barrier layer 13 is inserted between the tunnel barrier layer 13 and a fixed layer 11, thereby improving the crystallinity of the tunnel barrier layer 13 and a recording layer 12.

FIG. 4 is a sectional view illustrating the structure of an MTJ element 10 according to the second embodiment. In this embodiment, the MTJ element 10 having a single pinned layer structure will be described.

The MTJ element 10 has a layered structure formed by sequentially stacking a crystal orientation underlayer 15, fixed layer 11A, interface fixed layer 11B, tunnel barrier layer 13, recording layer 12, and cap layer 14. The layered structure may have a reversed stacking order. A lower electrode 16 is provided on the lower surface of the crystal orientation underlayer 15. An upper electrode 17 is provided on the upper surface of the cap layer 14.

The fixed layer 11 of this embodiment is formed by stacking the fixed layer 11A and interface fixed layer 11B. The fixed layer 11A shown in FIG. 4 is made of the same magnetic material as the fixed layer 11 of the first embodiment. When a 10- to 20-nm thick FePt layer having an $L1_0$ structure and the (001) plane oriented is used as the fixed layer 11A, a twin crystal with the (111) plane oriented can be formed on the upper interface of the FePt layer. When an MgO layer serving as the tunnel barrier layer 13 is formed on the fixed layer 11A, the orientation of MgO degrades, and the (001) plane orientation of FePt used for the recording layer 12 also degrades. As a result, the magnetic characteristic degrades, resulting in low reliability of the recording layer 12.

In this embodiment, the interface fixed layer 11B is made of a magnetic material, and is inserted between the fixed layer 11A and the tunnel barrier layer 13. A CoFeB alloy layer with a thickness of about 0.4 to 4 nm is used as the interface fixed layer 11B. This improves the crystallinity of MgO and consequently improves the crystallinity of the recording layer 12, as compared to a structure without the interface fixed layer 11B. When a film made of an alloy containing at least one element of Fe, Co, and Ni, such as a CoFeB alloy, FeB alloy, or CoFeNiB alloy, is used as the interface fixed layer 11B, a high MR and high spin injection efficiency can be obtained.

Third Embodiment

In the third embodiment, a magnetic layer to enhance the magnetoresistive effect is inserted between a recording layer 12 and a tunnel barrier layer 13, thereby improving the characteristic of an MTJ element 10.

FIG. 5 is a sectional view illustrating the structure of the MTJ element 10 according to the third embodiment. In this embodiment, the MTJ element 10 having a single pinned layer structure will be described.

The MTJ element 10 has a layered structure formed by sequentially stacking a crystal orientation underlayer 15, fixed layer 11, tunnel barrier layer 13, interface recording layer 12B, recording layer 12A, and cap layer 14. The layered structure may have a reversed stacking order. A lower electrode 16 is provided on the lower surface of the crystal orientation underlayer 15. An upper electrode 17 is provided on the upper surface of the cap layer 14.

The recording layer 12 of this embodiment is formed by stacking the interface recording layer 12B and recording layer 12A. The recording layer 12A shown in FIG. 5 is made of the same magnetic material as the recording layer 12 of the first embodiment.

A ferromagnetic material with a high polarizability is used for the interface recording layer 12B. More specifically, a magnetic material containing, as the main component, fcc-Co with the (001) plane oriented or bcc-Fe with the (001) plane oriented is used. The interface recording layer 12B has an effect of enhancing the magnetoresistive effect and an effect of reducing the write current upon spin injection write.

The recording layer 12 is formed in the following way. The interface recording layer 12B of the above-described material having a thickness of about 0.4 to 3 nm is formed on the tunnel barrier layer 13. Then, an FePt (001) layer ordered by film formation at 300° C. and having a thickness of about 1 to 10 nm is formed on the interface recording layer 12B. The cap layer 14 of MgO is formed on the recording layer 12.

In the MTJ element 10 having the above-described structure, a high thermal stability can be obtained by the recording layer 12A. In addition, a polarizability improving effect and a dumping constant reducing effect can be obtained by the interface recording layer 12B. As a result, the MTJ element 10 can implement magnetization switching by a small current.

The second embodiment is also applicable to the third embodiment. More specifically, the recording layer 12 includes the recording layer 12A and interface recording layer 12B. The fixed layer 11 includes a fixed layer 11A and an interface fixed layer 11B. In the MTJ element 10 with this structure, the crystallinity of the recording layer 12 improves, and magnetization switching by a small current is possible.

Fourth Embodiment

In the fourth embodiment, an intermediate layer made of a nonmagnetic material to promote ordering is inserted in a recording layer 12, thereby promoting its ordering. In addition, the magnetic characteristic of an MTJ element 10 is improved.

Figure 6:
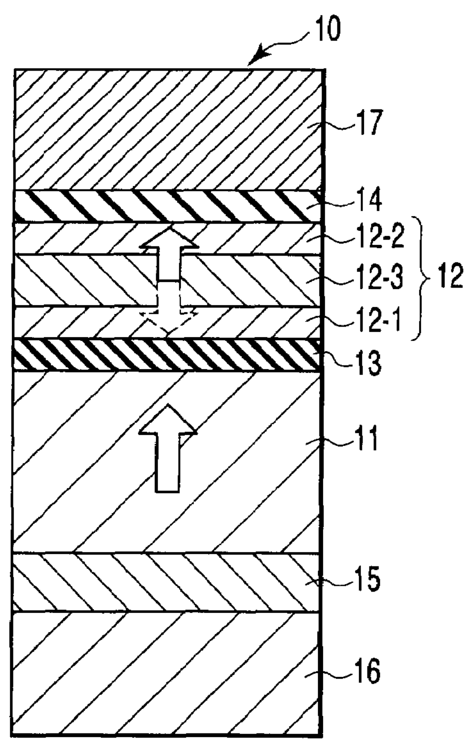
FIG. 6 is a sectional view illustrating the structure of an MTJ element 10 according to the fourth embodiment.

FIG. 6 is a sectional view illustrating the structure of the MTJ element 10 according to the fourth embodiment. Arrows in FIG. 6 indicate magnetization directions. In this embodiment, the MTJ element 10 having a single pinned layer structure will be described.

The recording layer 12 is formed by stacking a first magnetic layer 12-1, intermediate layer 12-3, and second magnetic layer 12-2 sequentially from the side of a tunnel barrier layer 13. The remaining components are the same as in the MTJ element 10 (FIG. 1) of the first embodiment.

The intermediate layer 12-3 is made of a nonmagnetic material to promote ordering of an alloy as the main component of the recording layer 12. For example, when the first magnetic layer 12-1 is made of Fe, and the second magnetic layer 12-2 is made of Pt, the intermediate layer 12-3 is made of, e.g., Mg. The recording layer 12 with this structure can ensure a high magnetic characteristic.

An example of the manufacturing method of the MTJ element 10 with the above-described structure will be described. The steps until formation of the tunnel barrier layer 13 are the same as in the first embodiment.

As shown in FIG. 7, an Fe layer having a thickness of about 1 nm is formed, as the first magnetic layer 12-1, on an MgO layer serving as the tunnel barrier layer 13. An Mg layer having a thickness of about 1 to 2 nm is formed on the first magnetic layer 12-1 as the intermediate layer 12-3. A Pt layer having a thickness of about 1 nm is formed on the intermediate layer 12-3 as the second magnetic layer 12-2. The second magnetic layer 12-2 may be made of an FePt alloy.

An MgO layer having a thickness of about 1 nm is formed on the second magnetic layer 12-2 as a cap layer 14. To suppress oxidation of the recording layer 12, the cap layer 14 may be formed by sequentially forming an Mg layer with a thickness of about 0.5 nm and an MgO layer with a thickness of about 0.5 nm. After that, annealing is executed at 500° C.

FIG. 8 is a graph illustrating the magnetic characteristic of the MTJ element 10 after the annealing. FIG. 8 shows the magnetic characteristic of the MTJ element 10 whose intermediate layer 12-3 varies in thickness within the range of 0 to 2 nm. FIG. 8 also shows the magnetic characteristic of the MTJ element 10 when the annealing is performed at 500° C. for 2 (H) or at 400° C. for 2 (H).

The value of a switching magnetic field Hc of perpendicular magnetization increases along with the thickness of Mg inserted between Fe and Pt. This is because insertion of Mg promotes interdiffusion of FePt. Insertion of Mg promotes ordering of FePt and improves the magnetic characteristic.

The insertion of Mg is believed to promote interdiffusion of FePt due to the following effect. Mg is non-solid-soluble in Fe but solid-soluble in Pt. When a layered film of Fe, Mg, and Pt is heated, Pt diffuses into Mg while mixing with it. Pt diffused into Mg reaches the interface between Fe and Mg.

Then, diffusion progresses while substituting Mg with Fe to form FePt. The movement of Mg at this time forms lattice vacancies, thereby reducing the diffusion energy for forming FePt.

The substrate is cooled down to near room temperature. A Ta layer with a thickness of about 100 nm is formed on the cap layer 14 as an upper electrode 17. At this time, Ta diffuses into the recording layer 12 through the thin MgO cap layer 14. To prevent the diffusion, a layer of, e.g., Ru (ruthenium), Au (gold), Ag (silver), Pt (platinum), Pd (palladium), Rh (rhodium), or Ir (iridium) is inserted between the cap layer 14 and the upper electrode 17 as an anti-diffusion layer.

As described above, when a nonmagnetic material to promote ordering is inserted between Fe and Pt, and annealing is executed, a high magnetic characteristic can be obtained with the same heat amount. The structure of the recording layer 12 is also applicable to the first, second, and third embodiments.

Fifth Embodiment

In the fifth embodiment, a material lattice-matching with a recording layer 12 is used for a cap layer 14, thereby improving the magnetic characteristic of the recording layer 12.

Figure 9:
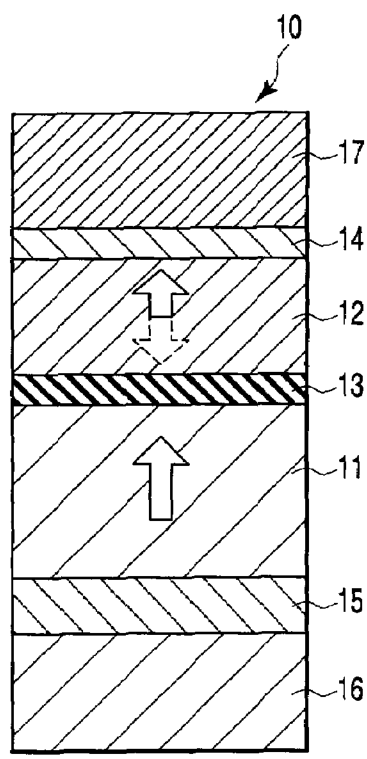
FIG. 9 is a sectional view illustrating the structure of an MTJ element 10 according to the fifth embodiment.

FIG. 9 is a sectional view illustrating the structure of an MTJ element 10 according to the fifth embodiment. In this embodiment, the MTJ element 10 having a single pinned layer structure will be described.

The MTJ element 10 has a layered structure formed by sequentially stacking a crystal orientation underlayer 15, fixed layer 11, tunnel barrier layer 13, recording layer 12, and cap layer 14. The layered structure may have a reversed stacking order. A lower electrode 16 is provided on the lower surface of the crystal orientation underlayer 15. An upper electrode 17 is provided on the upper surface of the cap layer 14.

For the cap layer 14, a metal containing at least one element of Ru (ruthenium), Al (aluminum), Au (gold), Ag (silver), Cr (chromium), Cu (copper), Pt (platinum), Pd (palladium), Rh (rhodium), and Ir (iridium) can be used. Using the cap layer 14 of such a material prevents separation of the recording layer 12 upon annealing. The remaining components are the same as in the first embodiment.

An example of the manufacturing method of the MTJ element 10 with the above-described structure will be described. The steps until formation of the tunnel barrier layer 13 are the same as in the first embodiment.

Figure 10:
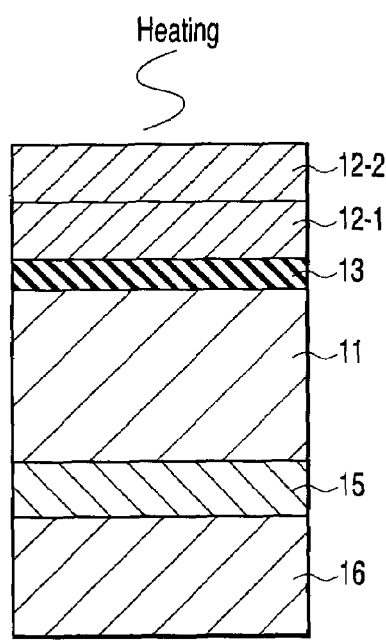
FIG. 10 is a sectional view illustrating a manufacturing method of the MTJ element 10 according to the fifth embodiment.

As shown in FIG. 10, an Fe layer serving as a first magnetic layer 12-1 and a Pt layer serving as a second magnetic layer 12-2 are sequentially formed on the tunnel barrier layer 13. The layered film is heated to about 400° C., thereby ordering the FePt alloy of the recording layer 12. Alternatively, an FePt alloy layer is formed by heating on the tunnel barrier layer 13 at about 300° C. This also orders the FePt alloy of the recording layer 12.

As shown in FIG. 9, the substrate is cooled down to near room temperature. An Au layer with a thickness of about 5 nm is formed on the recording layer 12 as the cap layer 14. Next, a Ta layer with a thickness of about 100 nm is formed on the cap layer 14 as the upper electrode 17.

In the MTJ element 10 with this structure, since a metal lattice-matching with the recording layer 12 is used for the cap layer 14, ordering of the recording layer 12 can be promoted. This improves the magnetic characteristic of the recording layer 12. The remaining effects are the same as in the first embodiment. This embodiment is also applicable to the second to fourth embodiments.

Sixth Embodiment

Figure 11:
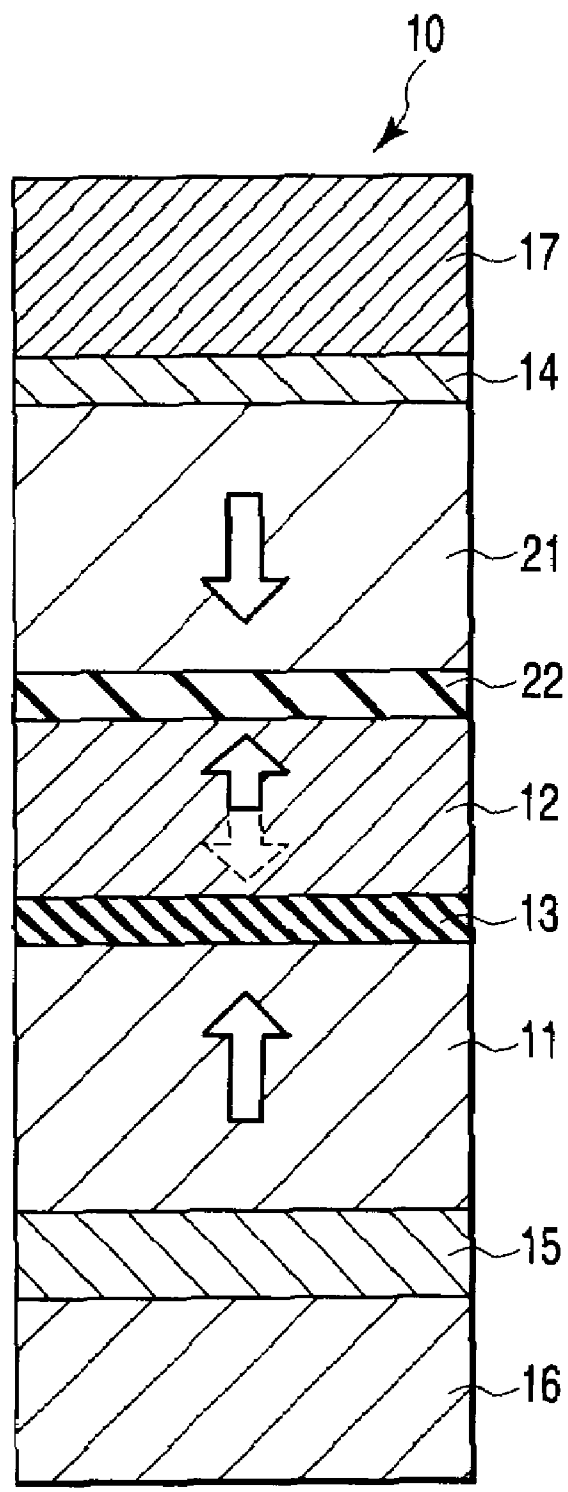
FIG. 11 is a sectional view illustrating the structure of an MTJ element 10 according to the sixth embodiment.

The sixth embodiment is an application example of the present invention to an MTJ element 10 having a dual pinned layer structure (i.e., a structure that arranges two pinned layers on both sides of a recording layer while sandwiching nonmagnetic layers). FIG. 11 is a sectional view illustrating the structure of the MTJ element 10 according to the sixth embodiment.

In the dual pinned layer structure, when a current flows in a certain out-of-plane direction, the spin injection effect and spin accumulation effect can be used simultaneously. Hence, the magnetization switching current can be reduced. As a characteristic feature of the dual pinned layer structure, since the two fixed layers arranged at both sides of the recording layer have opposite magnetization directions, the current density necessary for magnetization switching of the recording layer does not depend on the direction of the current so that "0" data and "1" data can be written by using the same current value. This prevents the write circuit from becoming complex.

The MTJ element 10 has a layered structure formed by sequentially stacking a crystal orientation underlayer 15, first fixed layer 11, first tunnel barrier layer 13, recording layer 12, second tunnel barrier layer 22, second fixed layer 21, and cap layer 14. The layered structure may have a reversed stacking order. A lower electrode 16 is provided on the lower surface of the crystal orientation underlayer 15. An upper electrode 17 is provided on the upper surface of the cap layer 14.

The first fixed layer 11 and second fixed layer 21 have a fixed magnetization (or spin) direction. The magnetization direction of the recording layer 12 changes (switches). The directions of easy magnetization of the first fixed layer 11, second fixed layer 21, and recording layer 12 are perpendicular to the film plane (or stacking plane). That is, the MTJ element 10 shown in FIG. 11 is a so-called perpendicular magnetic MTJ element in which the magnetization directions of the first fixed layer 11, second fixed layer 21, and recording layer 12 are perpendicular to the film plane.

As the first fixed layer 11, second fixed layer 21, and recording layer 12 to implement perpendicular magnetization, a magnetic material having an $L1_0$ structure or $L1_2$ structure based on an fct (face-centered tetragonal) structure with the (001) plane oriented is used. The materials of the first fixed layer 11 and recording layer 12 are the same as in the first embodiment.

Detailed examples of the magnetic material of the second fixed layer 21 are an ordered alloy having an $L1_0$ crystal structure and containing at least one element of Fe (iron), Co (cobalt), Ni (nickel), Mn (manganese), and Cr (chromium), and at least one element of Pt (platinum), Pd (palladium), Rh (rhodium), Au (gold), Hg (mercury), and Al (aluminum).

When a magnetic layer with a large switching current is used as the first fixed layer 11 and second fixed layer 21, and a magnetic layer with a switching current smaller than that of the first fixed layer 11 (or second fixed layer 21) is used as the recording layer 12, a high-performance MTJ element 10 can be obtained. When magnetization switching is caused by spin-polarized electrons, the switching current is proportional to saturation magnetization, anisotropy magnetic field, and activation volume. By appropriately adjusting them, a difference can be generated between the switching current of the recording layer 12 and that of the first fixed layer 11 (or second fixed layer 21).

As the first tunnel barrier layer 13 and second tunnel barrier layer 22, a nonmagnetic material having a tetragonal or cubic crystal structure is used. As the tunnel barrier layers 13 and 22, an oxide containing at least one element of Li (lithium), Be (beryllium), Na (sodium), Mg (magnesium), Nb (niobium), Ti (titanium), V (vanadium), Ta (tantalum), and Ba (barium), or a nitride containing at least one element of Ti (titanium) and V (vanadium) is used.

As the cap layer 14, a metal is preferably used so as not to degrade the magnetoresistive effect. Examples of the material of the cap layer 14 are Ru (ruthenium), Al (aluminum), Au (gold), Ag (silver), Cr (chromium), Cu (copper), Pt (platinum), Pd (palladium), Rh (rhodium), and Ir (iridium).

A resistance R1 of the first tunnel barrier layer 13 and a resistance R2 of the second tunnel barrier layer 22 are designed to satisfy R1>R2 or R2>R1. When the first tunnel barrier layer 13 and second tunnel barrier layer 22 are made of the same nonmagnetic material, they are designed to have different thicknesses. Alternatively, the resistances R1 and R2 and MR may be adjusted by inserting, between the second tunnel barrier layer 22 and the recording layer 12, a metal space layer made of a material that lattice-matches the recording layer 12 and does not degrade the MR ratio. Examples of the material of the metal space layer are Au and Cu.

The resistances R1 and R2 and MR may be adjusted by inserting a metal space layer made of a material that does not degrade the MR ratio between the second tunnel barrier layer 22 and the second fixed layer 21. Examples of the material of the metal space layer are Au and Cu.

In the MTJ element 10 having the above-described structure, data is written in the following way. First, the MTJ element 10 is energized to flow a current in both directions perpendicular to the film plane (or stacking plane).

When electrons are supplied from the side of the fixed layer 11 (i.e., electrons move from the fixed layer 11 to the recording layer 12), electrons spin-polarized in the same direction as the magnetization of the fixed layer 11 and electrons reflected by the fixed layer 21 and spin-polarized in a direction reverse to the magnetization of the fixed layer 21 are injected into the recording layer 12. In this case, the magnetization of the recording layer 12 is aligned in the same direction as the magnetization of the fixed layer 11 so that the magnetizations of the fixed layer 11 and recording layer 12 have a parallel alignment. In this parallel alignment, the resistance value of the MTJ element 10 is minimum. This state is defined as data "0".

When electrons are supplied from the side of the fixed layer 21 (i.e., electrons move from the fixed layer 21 to the recording layer 12), electrons spin-polarized in the same direction as the magnetization of the fixed layer 21 and electrons reflected by the fixed layer 11 and spin-polarized in a direction reverse to the magnetization of the fixed layer 11 are injected into the recording layer 12. In this case, the magnetization of the recording layer 12 is aligned in the direction reverse to the magnetization of the fixed layer 11 so that the magnetizations of the fixed layer 11 and recording layer 12 have an antiparallel alignment. In this antiparallel alignment, the resistance value of the MTJ element 10 is maximum. This state is defined as data "1".

Data is read out by supplying a read current to the MTJ element 10 and detecting a change in resistance value of the MTJ element 10. The read current is set to a value smaller than the write current.

Figure 12:
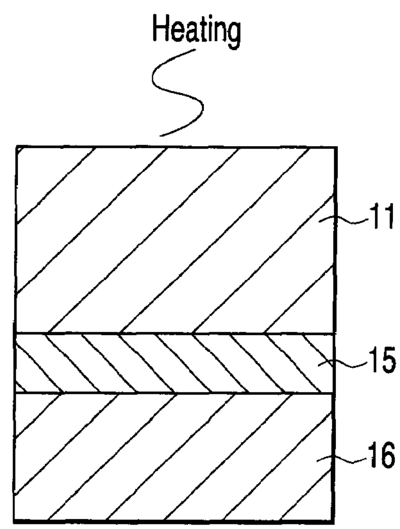
FIG. 12 is a sectional view illustrating a manufacturing method of the MTJ element 10 according to the sixth embodiment.

An example of the manufacturing method of the MTJ element 10 with this structure will be described. First, as shown in FIG. 12, the lower electrode 16 (e.g., a Ta layer with a thickness of about 100 nm) and the underlayer 15 are sequentially formed on a substrate (not shown). For example, an FePt layer with a thickness of about 10 to 20 nm is formed on the underlayer 15 as the first fixed layer 11 so that it has the (001) plane oriented. Ordering of the first fixed layer 11 is possible by forming the FePt alloy layer at a high temperature. Alternatively, when Fe and Pt layers are sequentially formed, and the layered film is heated, the first fixed layer 11 can change to an ordered structure.

Figure 13:
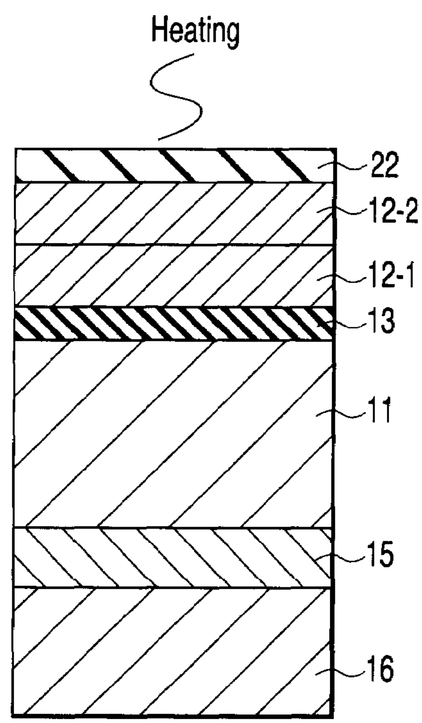
FIG. 13 is a sectional view illustrating a manufacturing method of the MTJ element 10 following FIG. 12.

Next, as shown in FIG. 13, the substrate is cooled down to near room temperature. An MgO layer with a thickness of about 0.4 to 1.0 nm is formed as the first tunnel barrier layer 13. To suppress oxidation of the fixed layer 11, the first tunnel barrier layer 13 may be formed by sequentially forming an Mg layer with a thickness of about 0.4 nm and an MgO layer with a thickness of about 0.6 nm. With this process, the MgO layer has the (001) plane oriented. The formed MgO layer may be heated to about 300° C. to improve its crystallinity. An interface layer having a thickness of about 0.4 to 3 nm and containing Fe or Co as the main component may be inserted between the first fixed layer 11 and the first tunnel barrier layer 13 to improve the spin polarizability.

An Fe layer having a thickness of about 1 to 3 nm and a bcc (body-centered cubic) structure with the (001) plane oriented is formed on the first tunnel barrier layer 13 as a first magnetic layer 12-1. Next, a Pt layer having a thickness of about 1 to 3 nm and an fcc (face-centered cubic) structure with the (001) plane oriented is formed on the first magnetic layer 12-1 as a second magnetic layer 12-2. An FePt alloy may be used for the second magnetic layer 12-2.

An MgO layer with a thickness of about 0.4 to 1.0 nm is formed on the second magnetic layer 12-2 as the second tunnel barrier layer 22. To suppress oxidation of the recording layer 12, the second tunnel barrier layer 22 may be formed by sequentially forming an Mg layer with a thickness of about 0.4 nm and an MgO layer with a thickness of about 0.5 nm. When the layered film is heated to about 400° C. or more, the FePt alloy of the recording layer 12 changes to an $L1_0$ ordered alloy. Hence, the recording layer 12 can obtain a high perpendicular magnetic anisotropy. It is also effective for ordering FePt to heat the layered film to a temperature of 400° C. or less, and for example, 300° C. to improve the crystallinity of the MgO layer serving as the second tunnel barrier layer 22 before the annealing at about 400° C.

Figure 14:
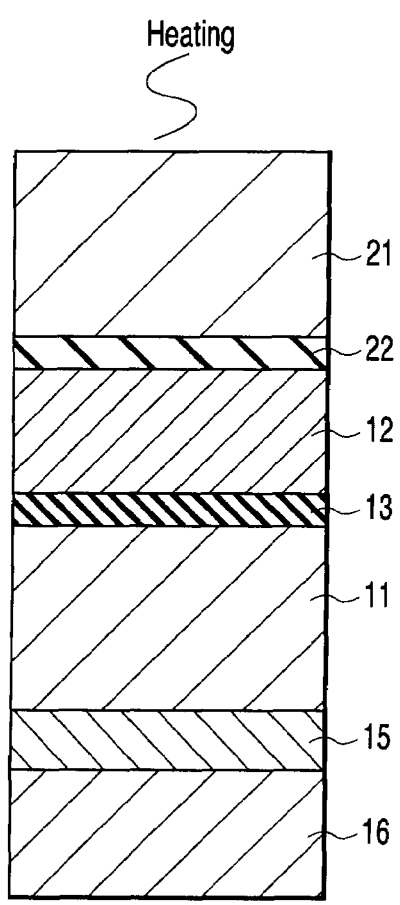
FIG. 14 is a sectional view illustrating a manufacturing method of the MTJ element 10 following FIG. 13.

As shown in FIG. 14, for example, an FePt layer with a thickness of about 10 nm is formed on the second tunnel barrier layer 22 as the second fixed layer 21. The second fixed layer 21 is oriented in the (001) plane. The second fixed layer 21 is formed by heating at, e.g., 300° C. Next, after the substrate is cooled down to near room temperature, the cap layer 14 with a thickness of about 5 nm and the upper electrode 17 (e.g., Ta) with a thickness of about 100 nm are sequentially formed, as shown in FIG. 11.

As described above in detail, even when the present invention is applied to a dual pinned layer structure, the same effect as in the first embodiment is obtained. The second and fourth embodiments are also applicable to this embodiment.

The second and third embodiments may be applied to this embodiment. More specifically, interface recording layers may be inserted between the recording layer 12 and the first tunnel barrier layer 13, between the recording layer 12 and the second tunnel barrier layer 22, between the fixed layer 11 and the first tunnel barrier layer 13, and between the fixed layer 21 and the second tunnel barrier layer 22. As the interface recording layers, a ferromagnetic material with a high polarizability is used. This allows the MTJ element 10 to implement magnetization switching by a low current.

Seventh Embodiment

In the seventh embodiment, a metal is used for a nonmagnetic layer between a recording layer 12 and a second fixed layer 21, thereby improving the MR of an MTJ element 10. In addition, a nonmagnetic material lattice-matching with the recording layer 12 is used for the nonmagnetic layer, thereby improving the magnetic characteristic of the recording layer 12.

Figure 15:
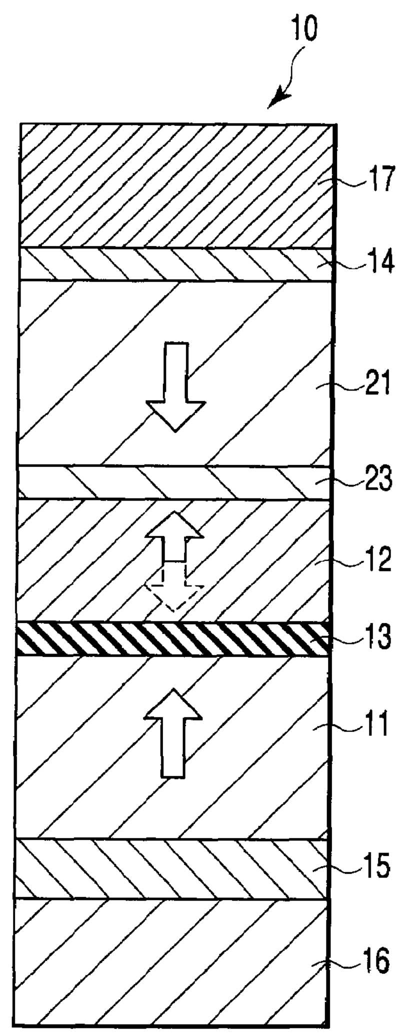
FIG. 15 is a sectional view illustrating the structure of an MTJ element 10 according to the seventh embodiment.

FIG. 15 is a sectional view illustrating the structure of the MTJ element 10 according to the seventh embodiment. In this embodiment, the MTJ element 10 with a dual pinned layer structure will be described.

The MTJ element 10 has a layered structure formed by sequentially stacking a crystal orientation underlayer 15, first fixed layer 11, tunnel barrier layer 13, recording layer 12, nonmagnetic metal layer 23, second fixed layer 21, and cap layer 14. The layered structure may have a reversed stacking order. A lower electrode 16 is provided on the lower surface of the crystal orientation underlayer 15. An upper electrode 17 is provided on the upper surface of the cap layer 14.

As the nonmagnetic metal layer 23, a nonmagnetic material lattice-matching with the recording layer 12 is used. More specifically, the following nonmagnetic materials (1) to (6) are usable for the nonmagnetic metal layer 23.

(1) An oxide containing at least one element of Li (lithium), Be (beryllium), Na (sodium), Mg (magnesium), Nb (niobium), Ti (titanium), V (vanadium), Ta (tantalum), and Ba (barium)

(2) A nitride containing at least one element of Ti (titanium) and V (vanadium)

(3) A carbide containing V (vanadium)

(4) A hydride containing at least one element of Li (lithium) and Pd (palladium)

(5) A selenide containing at least one element of Zr (zirconium) and Ho (holmium)

(6) A metal containing at least one element of Au (gold), Ag (silver), and Cu (copper)

When the nonmagnetic metal layer 23 is made of a metal, a GMR (Giant MagnetoResistive) effect is usable. A resistance R1 of the tunnel barrier layer 13 and a resistance R2 of the nonmagnetic metal layer 23 are designed to satisfy R1>R2 or R2>R1.

The structures of the first fixed layer 11, tunnel barrier layer 13, and recording layer 12 are the same as in the sixth embodiment. In addition to the magnetic materials described in the sixth embodiments, the following materials (1) to (3) are also usable for the first fixed layer 11 and second fixed layer 21.

(1) Disordered Alloys

Alloys containing Co (cobalt) as the main component and at least one element of Cr (chromium), Ta (tantalum), Nb (niobium), V (vanadium), W (tungsten), Hf (hafnium), Ti (titanium), Zr (zirconium), Pt (platinum), Pd (palladium), Fe (iron), and Ni (nickel). Examples are an CoCr alloy, CoPt alloy, CoCrTa alloy, CoCrPt alloy, CoCrPtTa alloy, and CoCrNb alloy. These alloys can adjust the magnetic anisotropy energy density and saturation magnetization by increasing the ratio of a nonmagnetic element.

(2) Artificial Lattices

A layered film formed by alternately stacking an alloy containing at least one element of Fe (iron), Co (cobalt), and Ni (nickel) and an alloy containing at least one element of Cr (chromium), Pt (platinum), Pd (palladium), Ir (iridium), Rh (rhodium), Ru (ruthenium), Os (osmium), Re (rhenium), Au (gold), and Cu (copper). Example are a Co/Pt artificial lattice, Co/Pd artificial lattice, CoCr/Pt artificial lattice, Co/Ru artificial lattice, Co/Os artificial lattice, Co/Au artificial lattice, and Ni/Cu artificial lattice. These artificial lattices can adjust the magnetic anisotropy energy density and saturation magnetization by adjusting the amount of doping of an element in the magnetic layer and the film thickness ratio of the magnetic layer and nonmagnetic layer.

(3) Ferrimagnetic Materials

Ferrimagnetic materials made of alloys of rare-earth metals and transition metals. An example is an amorphous alloy containing at least one element of Tb (terbium), Dy (dysprosium), Gd (gadolinium), and transition metals. Examples are TbFe, TbCo, TbFeCo, DyTbFeCo, and GdTbCo. These alloys can adjust the magnetic anisotropy energy density and saturation magnetization by adjusting the composition ratio.

An example of the manufacturing method of the MTJ element 10 with the above-described structure will be described. The steps until formation of the tunnel barrier layer 13 are the same as in the sixth embodiment.

As shown in FIG. 16, an Fe layer serving as a first magnetic layer 12-1 and a Pt layer serving as a second magnetic layer 12-2 are sequentially formed on the tunnel barrier layer 13. When the layered film is heated to about 400° C., the FePt alloy of the recording layer 12 changes to an ordered alloy. Alternatively, an FePt alloy layer is formed on the tunnel barrier layer 13 by heating at about 300° C. This also enables to order the FePt alloy of the recording layer 12.

After the substrate is cooled down to near room temperature, an Au layer with thickness of about 3 nm is formed on the recording layer 12 as the nonmagnetic metal layer 23, as shown in FIG. 15. For example, an FePt layer with a thickness of about 10 nm is formed on the nonmagnetic metal layer 23 as the second fixed layer 21 so that it has the (001) plane oriented. The second fixed layer 21 is formed by heating at, e.g., 300° C. After the substrate is cooled down to near room temperature, the cap layer 14 (e.g., Au) with a thickness of about 5 nm and the upper electrode 17 (e.g., Ta) with a thickness of about 100 nm are sequentially formed.

In the MTJ element 10 with this structure, since a nonmagnetic material lattice-matching with the recording layer 12 is used for the nonmagnetic metal layer 23, ordering of the recording layer 12 can be promoted. This improves the magnetic characteristic of the recording layer 12. When a metal is used for the second tunnel barrier layer, the MR of the MTJ element 10 can be improved. The second to fourth embodiments may be applied to this embodiment.

Eighth Embodiment

In the eighth embodiment, an example will be described in which an MRAM is formed by using the above-described MTJ element 10.

FIG. 17 is a circuit diagram illustrating the arrangement of an MRAM according to the eighth embodiment. The MRAM has a memory cell array 30 including a plurality of memory cells MC arrayed in a matrix. A plurality of pairs of bit lines BL and /BL running in the column direction are arranged on the memory cell array 30. A plurality of word lines WL running in the row direction are also arranged on the memory cell array 30.

Each of the above-described memory cells MC exists at an intersection between the bit lines BL and the word lines WL. Each memory cell MC includes the MTJ element 10 and a selection transistor 31. One terminal of the MTJ element 10 connects to the bit line BL. The other terminal of the MTJ element 10 connects to the drain terminal of the selection transistor 31. The gate terminal of the selection transistor 31 connects to the word line WL. The source terminal of the selection transistor 31 connects to the bit line /BL.

A row decoder 32 connects to the word lines WL. A write circuit 34 and a read circuit 35 connect to the pairs of bit lines BL and /BL. A column decoder 33 connects to the write circuit 34 and read circuit 35. The row decoder 32 and column decoder 33 select each memory cell MC.

Data write in the memory cell MC is executed in the following way. To select the memory cell MC as a data write target, the word line WL connected to the memory cell MC is activated. This turns on the selection transistor 31.

A bidirectional write current Iw is supplied to the MTJ element 10. More specifically, when the write current Iw is supplied to the MTJ element 10 from the left to right, the write circuit 34 applies a positive potential to the bit line BL and a ground potential to the bit line /BL. When the write current Iw is supplied to the MTJ element 10 from the right to left, the write circuit 34 applies a positive potential to the bit line /BL and a ground potential to the bit line BL. This allows to write data "0" or data "1" in the memory cell MC.

Data read from the memory cell MC is executed in the following way. First, the memory cell MC is selected. The read circuit 35 supplies a read current Ir flowing, e.g., from the right to left to the MTJ element 10. The read circuit 35 detects the resistance value of the MTJ element 10 on the basis of the read current Ir. This allows to read out data stored in the MTJ element 10.

As described above in detail, according to this embodiment, an MRAM can be formed by using the MTJ element 10 described in the first to seventh embodiments. Additionally, utilization of the MTJ element 10 described in the first to seventh embodiments enables to form an MRAM capable of microfabrication and reduction of the switching current density.

The MTJ element 10 and MRAM according to the first to eighth embodiments of the present invention are applicable to various devices. FIGS. 18 to 24 illustrate several application examples.

APPLICATION EXAMPLE 1

Figure 18:
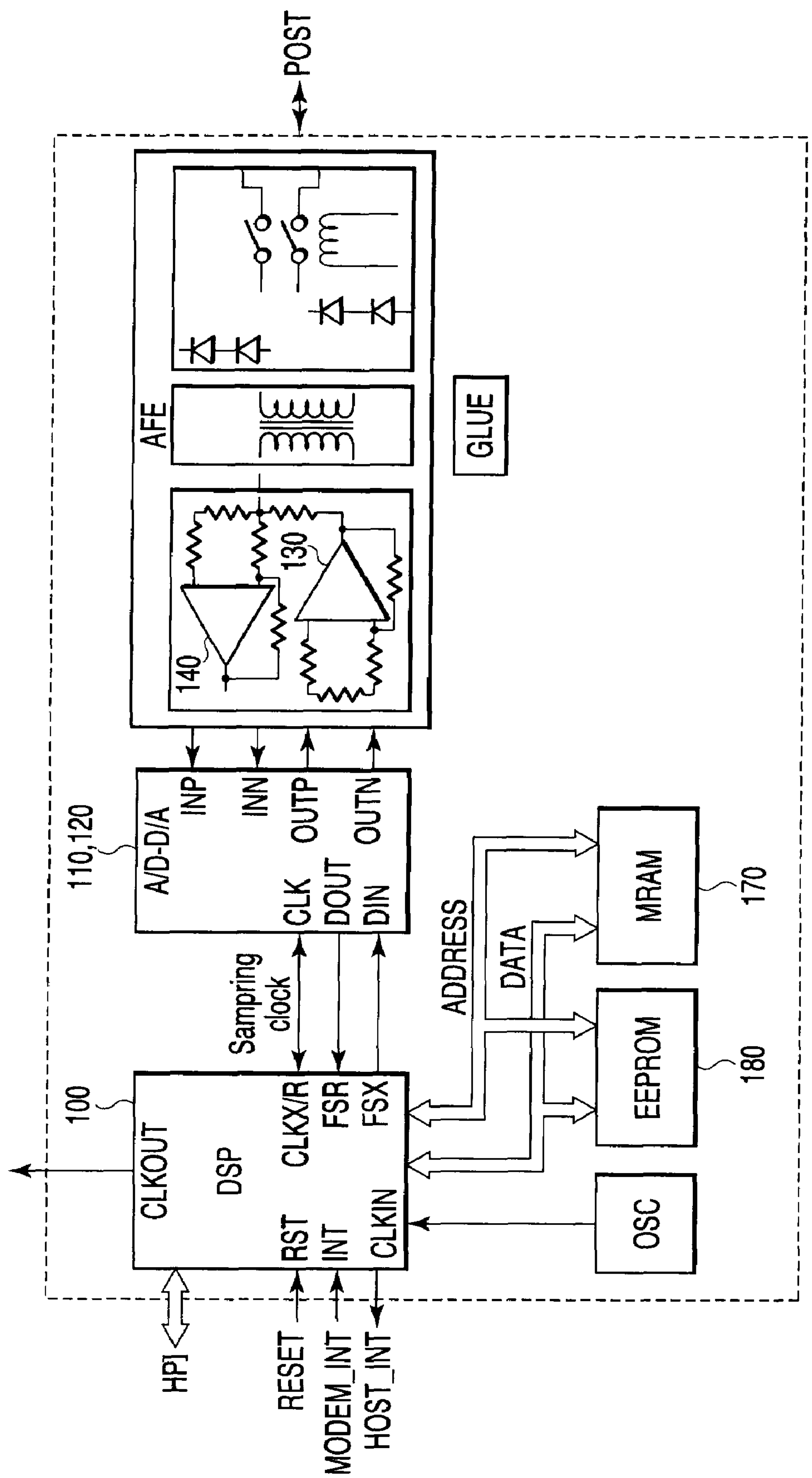
FIG. 18 is a block diagram illustrating the DSL (Digital Subscriber Line) data path portion of a DSL modem so as to explain Application Example 1 of the MRAM.

FIG. 18 shows the DSL (Digital Subscriber Line) data path portion of a DSL modem. This modem includes a programmable digital signal processor (DSP) 100, analog/digital (A/D) converter 110, digital/analog (D/A) converter 120, transmission driver 130, and reception amplifier 140.

FIG. 18 does not illustrate a bandpass filter. FIG. 18 illustrates an MRAM 170 according to this embodiment and an EEPROM 180 as optional memories of various types to hold a line code program (a program which is executed by the DSP to select and operate a modem in accordance with encoded subscriber line information and transmission conditions (line code; QAM, CAP, RSK, FM, AM, PAM, DWMT, and the like)).

In Application Example 1, two kinds of memories, i.e., the MRAM 170 and EEPROM 180 are used as memories to hold the line code program. An MRAM may replace the EEPROM 180. That is, instead of using two kinds of memories, only MRAMs may be used.

APPLICATION EXAMPLE 2

Figure 19:
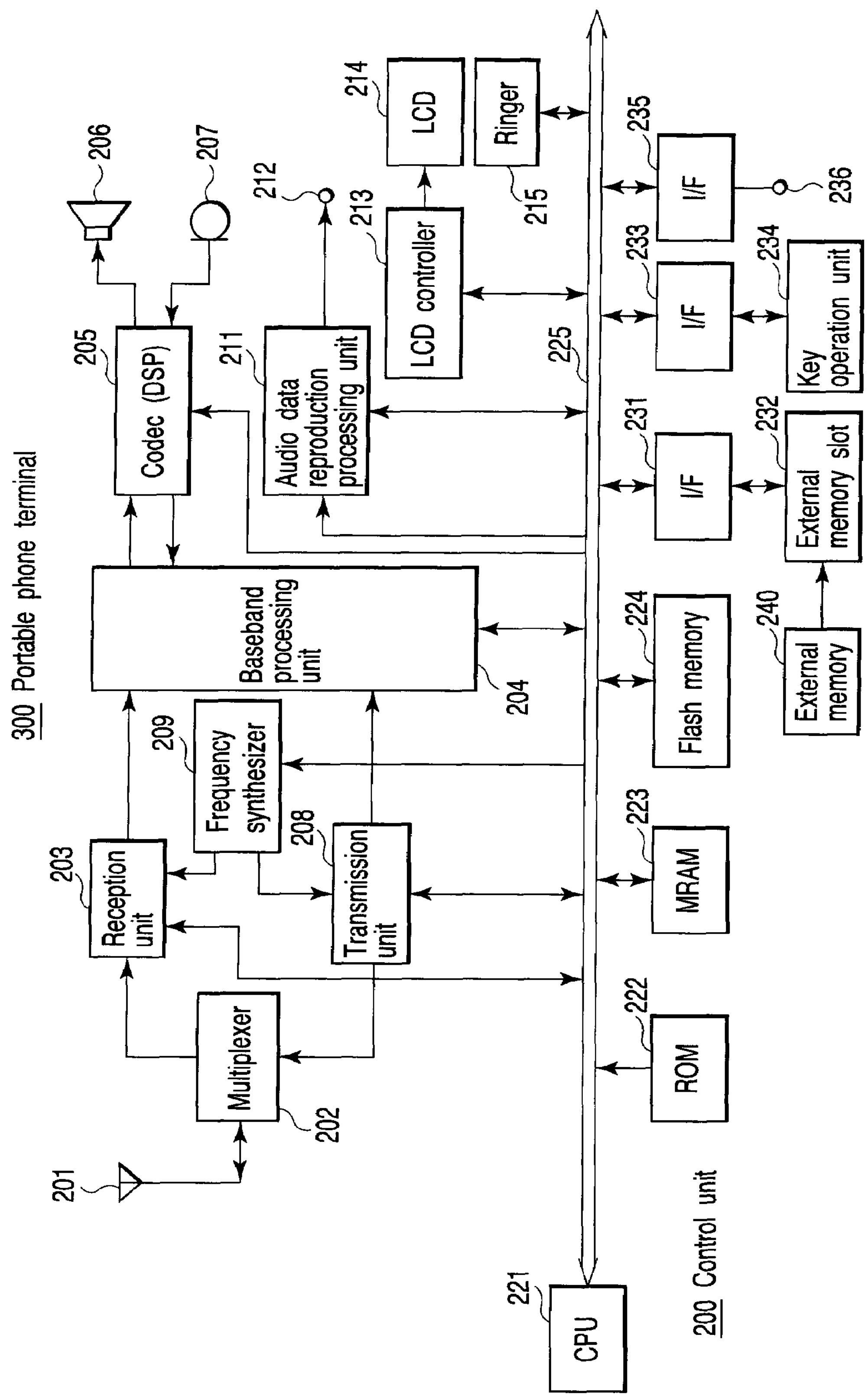
FIG. 19 is a block diagram illustrating a portable phone terminal so as to explain Application Example 2 of the MRAM.

FIG. 19 illustrates a portable phone terminal 300 as another application example. A communication unit 200 which implements a communication function includes a transmitting/receiving antenna 201, a multiplexer 202, a reception unit 203, a baseband processing unit 204, a DSP 205 used as a voice codec, a loudspeaker (receiver) 206, a microphone (transmitter) 207, a transmission unit 208, and a frequency synthesizer 209.

The portable phone terminal 300 has a control unit 220 which controls the units of the portable phone terminal. The control unit 220 is a microcomputer formed by connecting a CPU 221, a ROM 222, an MRAM 223 of this embodiment, and a flash memory 224 via a CPU bus 225. The ROM 222 stores, in advance, programs to be executed by the CPU 221 and necessary data such as fonts to be displayed. The MRAM 223 mainly serves as a work area where the CPU 221 stores, as needed, data midway through calculation during executing the programs, or data exchanged between the control unit 220 and the respective units are temporarily stored. Even when the portable phone terminal 300 is powered off, the flash memory 224 stores, e.g., the immediately preceding set conditions so that the same set conditions are available at the next power-on. Hence, even when the portable phone terminal is powered off, the set parameters can remain stored.

The portable phone terminal 300 also has an audio reproduction processing unit 211, an external output terminal 212, an LCD (Liquid Crystal Display) controller 213, an LCD 214 for display, and a ringer 215 which generates a ringing signal. The audio reproduction processing unit 211 reproduces audio information input to the portable phone terminal 300 (or audio information stored in an external memory 240 (to be described later)). The reproduced audio information can be transmitted to a headphone or a portable loudspeaker through the external output terminal 212 and extracted to the outside. Providing the audio reproduction processing unit 211 allows reproduction of audio information. The LCD controller 213 receives display information from, e.g., the CPU 221 via the CPU bus 225, converts it into LCD control information to control the LCD 214, and drives the LCD 214 to perform display.

The portable phone terminal 300 also includes interface circuits (I/Fs) 231, 233, and 235, the external memory 240, an external memory slot 232, a key operation unit 234, and an external input/output terminal 236. The external memory slot 232 receives the external memory 240 such as a memory card. The external memory slot 232 connects to the CPU bus 225 via the interface circuit (I/F) 231. When the portable phone terminal 300 has the slot 232, it is possible to write, in the external memory 240, information in the portable phone terminal 300 or input, to the portable phone terminal 300, information (e.g., audio information) stored in the external memory 240. The key operation unit 234 connects to the CPU bus 225 via the interface circuit (I/F) 233. Key input information input from the key operation unit 234 is transmitted to, e.g., the CPU 221. The external input/output terminal 236 connects to the CPU bus 225 via the interface circuit (I/F) 233 and functions as a terminal to input various kinds of external information to the portable phone terminal 300 or output information externally from the portable phone terminal 300.

In Application Example 2, the ROM 222, MRAM 223, and flash memory 224 are used. An MRAM may replace the flash memory 224. A MRAM may also replace the ROM 222.

APPLICATION EXAMPLE 3

FIGS. 20 to 24 illustrate examples in which an MRAM is applied to a card (MRAM card) such as a smart medium to store media contents.

As shown in FIG. 20, an MRAM card main body 400 incorporates an MRAM chip 401. The card main body 40 has an opening 402 at a position corresponding to the MRAM chip 401 so that the MRAM chip 401 is exposed. The opening 402 has a shutter 403 to protect the MRAM chip 401 when the user carries the MRAM card. The shutter 403 is made of a material such as a ceramic capable of shielding an external magnetic field. To transfer data, the shutter 403 is opened to expose the MRAM chip 401. An external terminal 404 is used to extract content data stored in the MRAM card.

Figure 21:
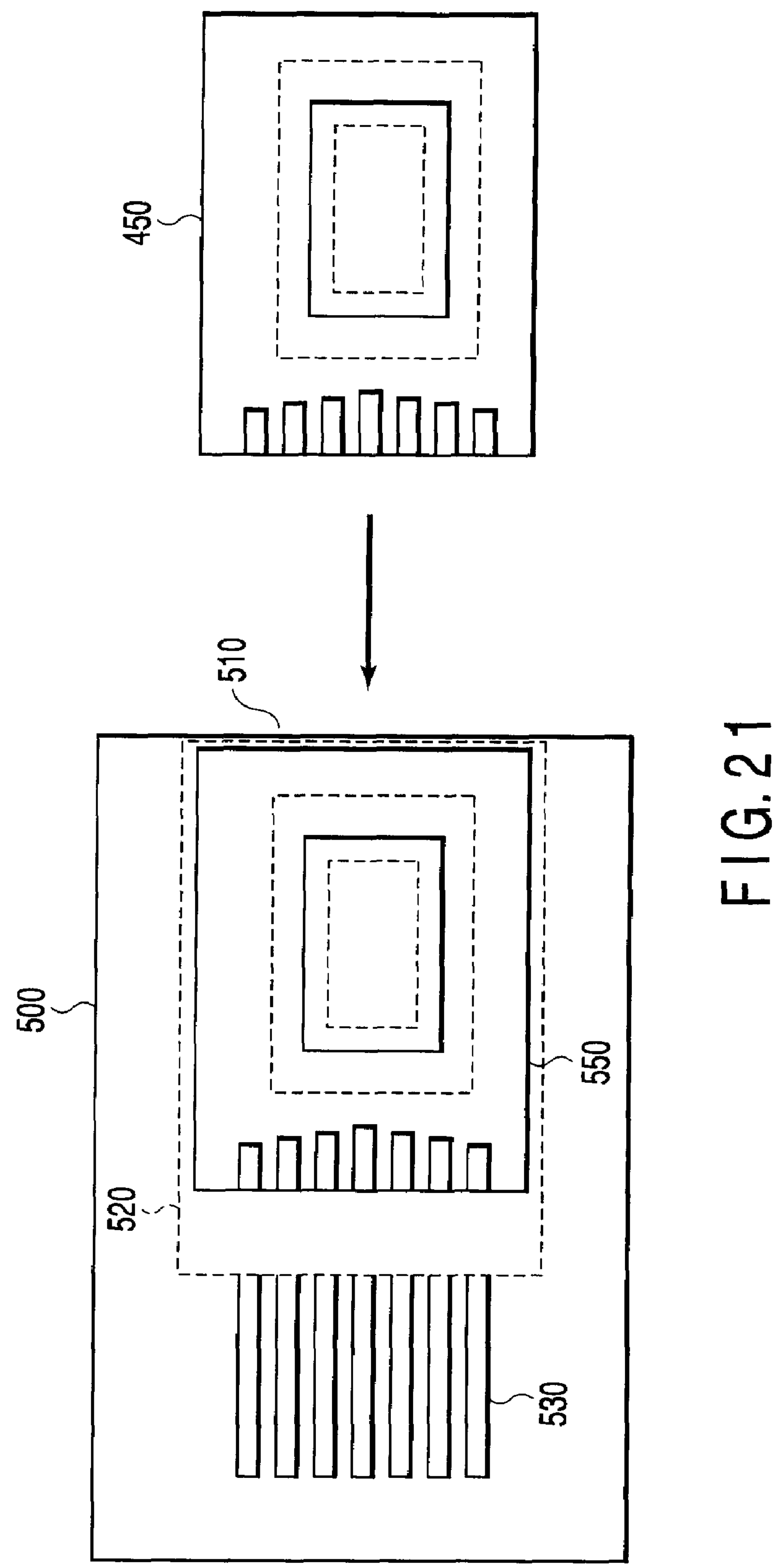
FIG. 21 is a plan view illustrating a transfer apparatus to transfer data to an MRAM card.
Figure 22:
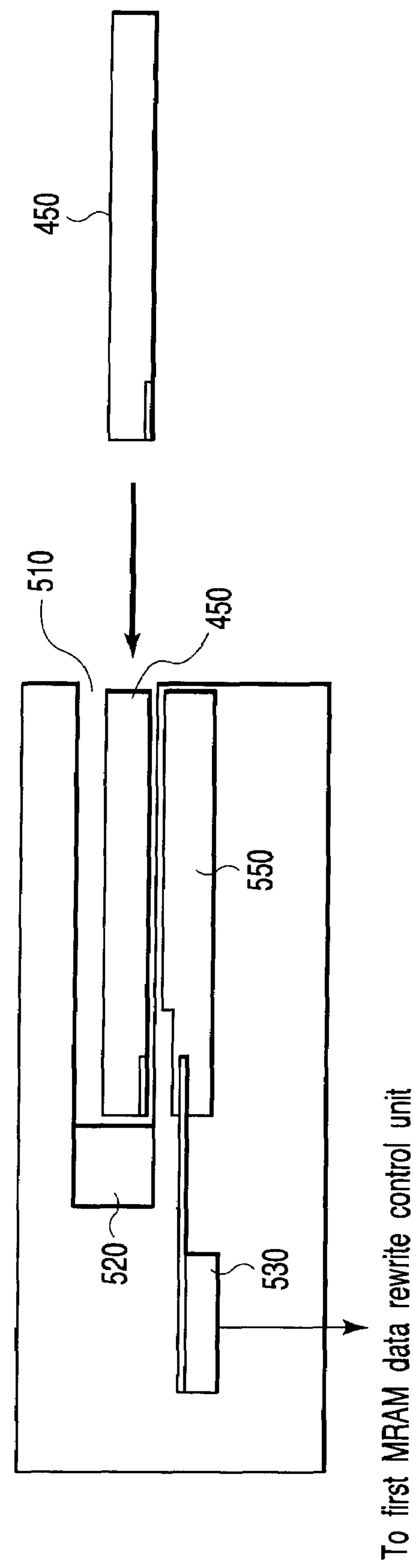
FIG. 22 is a sectional view illustrating the transfer apparatus to transfer data to an MRAM card.

FIGS. 21 and 22 are plan and sectional views illustrating a card insertion type transfer apparatus for transferring data to the MRAM card. A second MRAM card 450 used by an end user is inserted from an insertion portion 510 of a transfer apparatus 500, as indicated by the arrow, and pushed in until the card abuts against a stopper 520. The stopper 520 also functions as a member to align a first MRAM 550 and the second MRAM card 450. When the second MRAM card 450 is located at a predetermined position, a first MRAM rewrite control unit supplies a control signal to an external terminal 530 so that data stored in the first MRAM 550 is transferred to the second MRAM card 450.

FIG. 23 illustrates a fitting type transfer apparatus. In this transfer apparatus, the second MRAM card 450 is fitted on the first MRAM 550 with reference to the stopper 520, as indicated by the arrow. The transfer method is the same as in the card insertion type, and a description thereof will not be repeated.

Figure 24:
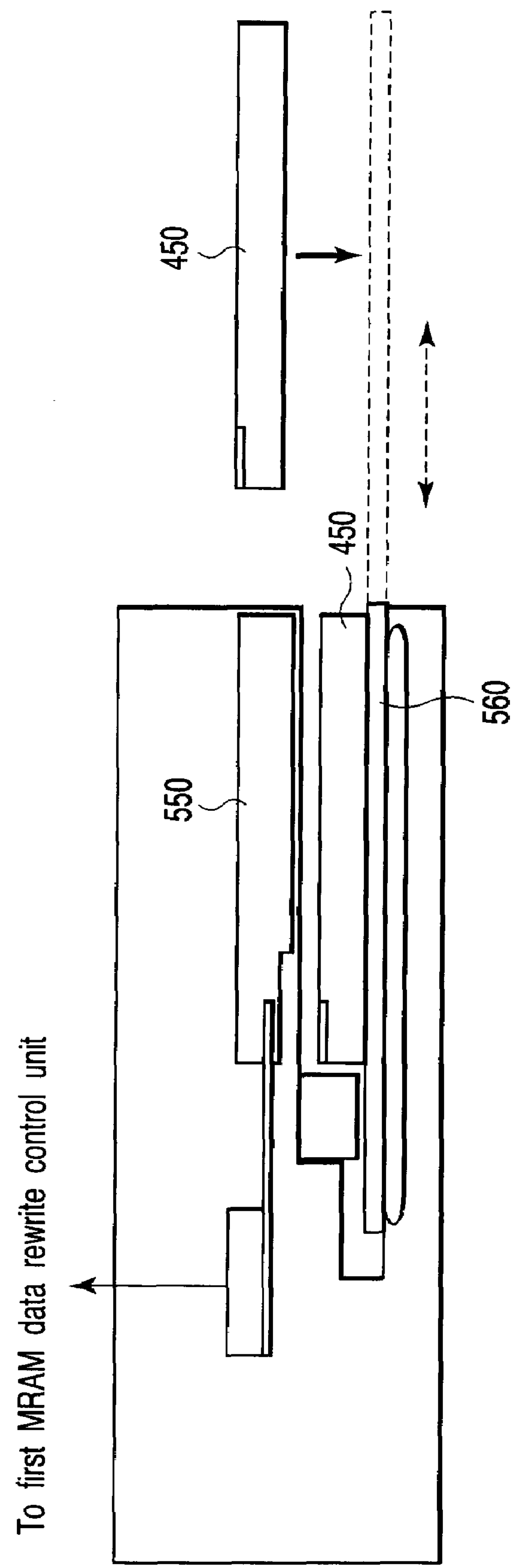
FIG. 24 is a sectional view illustrating a slide type transfer apparatus to transfer data to an MRAM card.

FIG. 24 illustrates a slide type transfer apparatus. The transfer apparatus 500 has a sliding tray 560, like a CD-ROM drive or DVD drive. The sliding tray 560 moves, as indicated by the arrow. When the sliding tray 560 moves to the position indicated by the broken line, the second MRAM card 450 is placed on the sliding tray 560 and conveyed into the transfer apparatus 500. The structure that conveys the second MRAM card 450 until it abuts against the stopper 520 and the transfer method are the same as in the card insertion type, and a description thereof will not be repeated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:

a free layer which contains a magnetic material and has an fct (face-centered tetragonal) crystal structure with a (001) plane oriented, the free layer having a magnetization which is perpendicular to a film plane and has a direction to be changeable by spin-polarized electrons;

a first nonmagnetic layer and a second nonmagnetic layer which sandwich the free layer and have one of a tetragonal crystal structure and a cubic crystal structure; and a fixed layer which is provided on only one side of the free layer and on a surface of the first nonmagnetic layer opposite to a surface with the free layer and contains a magnetic material, the fixed layer having a magnetization which is perpendicular to a film plane and has a fixed direction.

2. The element according to claim 1, wherein the first nonmagnetic layer is made of one of an oxide containing at least one element selected from the group consisting of Li, Be, Na, Mg, Nb, Ti, V, Ta, and Ba, and a nitride containing at least one element selected from the group consisting of Ti and V.

3. The element according to claim 1, wherein the second nonmagnetic layer is made of one of an oxide containing at least one element selected from the group consisting of Li, Be, Na, Mg, Nb, Ti, V, Ta, and Ba, a nitride containing at least one element selected from the group consisting of Ti and V, a carbide containing V, a hydride containing at least one element selected from the group consisting of Li and Pd, a selenide containing at least one element selected from the group consisting of Zr and Ho, and a metal or an intermetallic compound containing at least one element selected from the group consisting of Al, Au, As, Ag, Be, Ga, P, Pt, Pd, Ir, Rh, Cu, V, Cr, Nb, Mo, Ta, and W.

4. The element according to claim 1, wherein the free layer has a thickness of not more than 10 nm.

5. The element according to claim 1, wherein the free layer has one of an $L1_0$ crystal structure and an $L1_2$ crystal structure.

6. The element according to claim 1, wherein the free layer contains an alloy made of at least one element selected from the group consisting of Fe, Co, Ni, Mn, and Cr, and at least one element selected from the group consisting of Pt, Pd, Rh, Au, Hg, and Al.

7. The element according to claim 6, wherein the free layer includes an intermediate layer which is inserted therein and made of a nonmagnetic material.

8. The element according to claim 6, wherein the free layer contains at least one element selected from the group consisting of Be, Mn, Cu, Sm, Au, Nd, Ag, Pr, La, Ca, Yb, Eu, Ce, Sr, Ba, Al, Mg, Zn, Pb, Cd, Sn, and In.

9. The element according to claim 6, wherein the free layer contains at least one element selected from the group consisting of Sn, Sb, Pb, and Bi.

10. The element according to claim 6, wherein the free layer contains at least one element selected from the group consisting of Li, Na, K, Be, Mg, Ca, and Sc.

11. The element according to claim 6, wherein the free layer contains at least one element selected from the group consisting of B and C.

12. The element according to claim 1, wherein the free layer contains, as a main component, an alloy made of at least one first element selected from the group consisting of Fe, Co, Ni, Mn, and Cr and at least one second element selected from the group consisting of Pt, Pd, Rh, Au, Hg, and Al, a composition ratio of the first element and the second element is set within a range of 40 to 60 atomic %, and an oxygen content of the alloy is not more than 1%.

13. The element according to claim 1, wherein the free layer contains, as a main component, an alloy made of at least one first element selected from the group consisting of Fe, Co, Ni, Mn, and Cr and at least one second element selected from the group consisting of Pt, Pd, Rh, Au, Hg, and Al, a content of the first element is smaller than that of the second element, and an oxygen content of the alloy is not less than 10%.

14. A magnetoresistive element comprising:

a free layer which contains a magnetic material and has an fct crystal structure with a (001) plane oriented, the free layer having a magnetization which is perpendicular to a film plane and has a direction to be changeable by spin-polarized electrons;

a first nonmagnetic layer and a second nonmagnetic layer which sandwich the free layer and have one of a tetragonal crystal structure and a cubic crystal structure;

a first fixed layer which is provided on a surface of the first nonmagnetic layer opposite to a surface with the free layer and contains a magnetic material, the first fixed layer having a magnetization which is perpendicular to a film plane and has a fixed direction; and a second fixed layer which is provided on a surface of the second nonmagnetic layer opposite to a surface with the free layer and contains a magnetic material, the second fixed layer having a magnetization which is perpendicular to a film plane and has a fixed direction, wherein the first nonmagnetic layer has a resistance value different from that of the second nonmagnetic layer.

15. The element according to claim 14, wherein the first nonmagnetic layer is made of one of an oxide containing at least one element selected from the group consisting of Li, Be, Na, Mg, Nb, Ti, V, Ta, and Ba, and a nitride containing at least one element selected from the group consisting of Ti and V.

16. The element according to claim 14, wherein the second nonmagnetic layer is made of one of an oxide containing at least one element selected from the group consisting of Li, Be, Na, Mg, Nb, Ti, V, Ta, and Ba, a nitride containing at least one element selected from the group consisting of Ti and V, a carbide containing V, a hydride containing at least one element selected from the group consisting of Li and Pd, a selenide containing at least one element selected from the group consisting of Zr and Ho, and a metal containing at least one element selected from the group consisting of Au, Ag, and Cu.

17. The element according to claim 14, wherein the free layer has a thickness of not more than 10 nm.

18. The element according to claim 14, wherein the free layer has one of an $L1_0$ crystal structure and an $L1_2$ crystal structure.

19. The element according to claim 14, wherein the free layer contains an alloy made of at least one element selected from the group consisting of Fe, Co, Ni, Mn, and Cr, and at least one element selected from the group consisting of Pt, Pd, Rh, Au, Hg, and Al.

20. The element according to claim 19, wherein the free layer includes an intermediate layer which is inserted therein and made of a nonmagnetic material.

21. A magnetic memory comprising a memory cell including a magnetoresistive element, and a first electrode and a second electrode which sandwich the magnetoresistive element and through which a current is supplied to the magnetoresistive element, the magnetoresistive element including:

a free layer which contains a magnetic material and has an fct crystal structure with a (001) plane oriented, the free layer having a magnetization which is perpendicular to a film plane and has a direction to be changeable by spin-polarized electrons;

a first nonmagnetic layer and a second nonmagnetic layer which sandwich the free layer and have one of a tetragonal crystal structure and a cubic crystal structure; and a fixed layer which is provided on only one side of the free layer and on a surface of the first nonmagnetic layer opposite to a surface with the free layer and contains a magnetic material, the fixed layer having a magnetization which is perpendicular to a film plane and has a fixed direction.

22. The memory according to claim 21, further comprising a write circuit which bidirectionally supplies the current to the magnetoresistive element through the first electrode and the second electrode.

23. The memory according to claim 22, wherein the memory cell includes a selection transistor electrically connected between the write circuit and the second electrode.

* * * * *